(12) United States Patent
Matsunaga et al.

(10) Patent No.: US 6,300,978 B1
(45) Date of Patent: Oct. 9, 2001

(54) MOS-TYPE SOLID-STATE IMAGING APPARATUS

(75) Inventors: Yoshiyuki Matsunaga, Kamakura; Shinji Ohsawa, Ebina; Nobuo Nakamura, Fuchu; Hirofumi Yamashita, Tokyo; Hiroki Miura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/022,038

(22) Filed: Feb. 11, 1998

Related U.S. Application Data

(63) Continuation of application No. PCT/JP96/02279, filed on Aug. 12, 1996, now abandoned.

(30) Foreign Application Priority Data

| Aug. 11, 1995 | (JP) | ................................. | 7-206140 |
| Aug. 11, 1995 | (JP) | ................................. | 7-206142 |
| Aug. 11, 1995 | (JP) | ................................. | 7-206143 |
| Mar. 15, 1996 | (JP) | ................................. | 8-059845 |

(51) Int. Cl.$^7$ ............................. H04N 5/217; H04N 3/14; H01L 31/062
(52) U.S. Cl. ......................... 348/308; 348/302; 348/307; 348/308; 257/291; 257/292
(58) Field of Search ..................................... 348/302–308, 348/241; 250/208.1, 281; 257/291, 292

(56) References Cited

U.S. PATENT DOCUMENTS

| 4,809,075 | 2/1989 | Akimoto et al. . |
| 4,819,070 | 4/1989 | Hynecek . |

(List continued on next page.)

FOREIGN PATENT DOCUMENTS

| 62-213485 | 9/1987 | (JP) . |
| 63-93282 | 4/1988 | (JP) . |
| 5-207220 | 8/1993 | (JP) . |
| 5-252445 | 9/1993 | (JP) . |
| WO97/07628 | 2/1997 | (WO) . |

OTHER PUBLICATIONS

Chamberlain, Savvas G. "Photosensitivity and Scanning of Silicon Image Detector Arrays." IEEE, Journal of Solid–State Circuits, vol. SC–4, No. 6, Dec. 1969, pp. 333–342.

*Primary Examiner*—Wendy R. Garber
*Assistant Examiner*—Rashawn N. Tillery
(74) *Attorney, Agent, or Firm*—Oblon, Spivak, McClelland, Maier & Neustadt, P.C.

(57) ABSTRACT

An MOS-type solid-state imaging apparatus includes unit cells arranged in a two-dimensional matrix, each unit cell being constituted by a photodiode, an amplification transistor having a gate to which an output from the photodiode is input, a vertical selection transistor connected in series with the amplification transistor, and a reset transistor connected between the drain and gate of the amplification transistor to discharge the signal from the photodiode, a plurality of vertical address lines connected to the gates of the vertical selection transistors and arranged in a row direction, a vertical address circuit for driving the vertical address lines, a plurality of vertical signal lines arranged in a column direction in which currents are read out from the amplification transistors, a plurality of load transistors each connected to one end of a corresponding one of the vertical signal lines, a plurality of horizontal selection transistors each connected to the other end of a corresponding one of the vertical signal lines, a horizontal address circuit for sequentially supplying selection pulse signals to the gates of the horizontal selection transistors, and a horizontal signal line for reading out signal currents from the vertical signal lines through the horizontal selection transistors.

22 Claims, 24 Drawing Sheets

U.S. PATENT DOCUMENTS

| | | |
|---|---|---|
| 4,942,474 | 7/1990 | Akimoto et al. . |
| 5,144,447 | 9/1992 | Akimoto et al. . |
| 5,172,249 | 12/1992 | Hashimoto . |
| 5,726,439 * | 3/1998 | Miyawaki et al. .................. 348/302 |
| 5,856,686 * | 1/1999 | Watanabe et al. .................. 348/302 |
| 5,912,483 * | 6/1999 | Hamada ............................... 257/291 |
| 6,037,577 * | 3/2000 | Tanaka et al. ....................... 348/302 |
| 6,091,449 * | 7/2000 | Matsunaga et al. ................. 348/308 |
| 6,166,767 * | 12/2000 | Watanabe ............................ 348/301 |

* cited by examiner

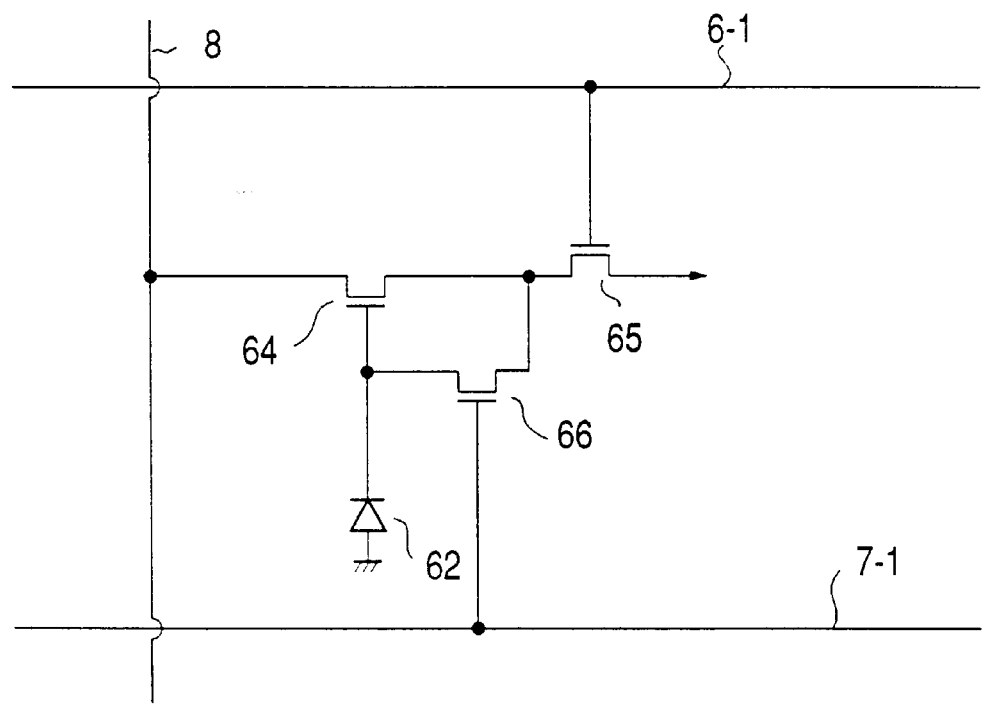
FIG.8A
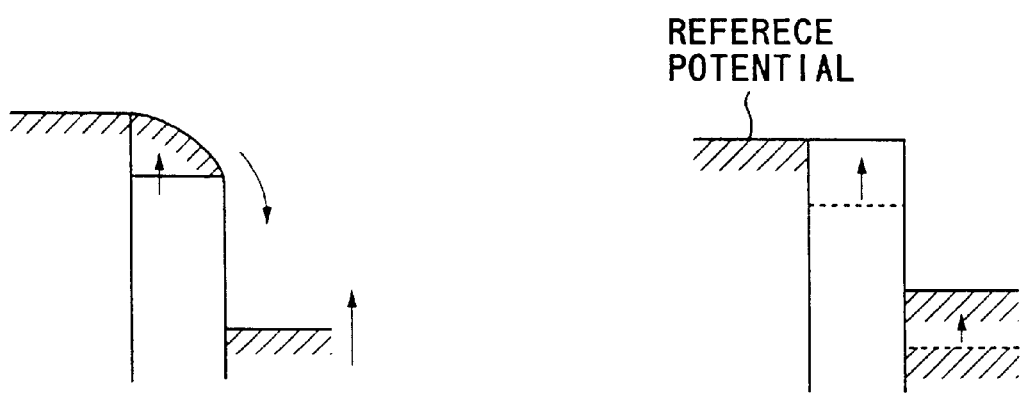
FIG.8B
FIG.8C

MOS-TYPE SOLID-STATE IMAGING APPARATUS

CROSS-REFERENCE TO RELATED APPLICATIONS

This is a continuation application of Application No. PCT/JP96/02279, filed Aug. 12, 1996, now abandoned.

BACKGROUND OF THE INVENTION

The present invention relates to a solid-state imaging apparatus using an amplification-type MOS sensor for amplifying signal charges within cells.

Recently, compact video cameras and high-resolution, high-vision solid-state imaging apparatuses have been developed. Strong demands have arisen for not only compact cameras and solid-state imaging apparatuses but also low-power-consumption, low-voltage solid-state imaging apparatuses as portable cameras and personal computer cameras.

As the chip size of a solid-state imaging apparatus decreases, however, the amount of signal charge to be processed decreases due to micropatterning. As a result, the dynamic range of the solid-state imaging apparatus narrows, and hence a clear, high-resolution video cannot be obtained. In addition, since many power supply voltages having two, three, or more values are used, a simple system cannot be coped with in terms of camera system configuration and handling. That is, for application to portable cameras and personal computer cameras, a solid-state imaging apparatus which attains a high S/N ratio and uses a single power supply, and also attains reductions in power consumption and voltage is required.

To solve this problem, several amplification-type solid-state imaging apparatuses using transistors have been proposed. These solid-state imaging apparatuses are designed to cause transistors to amplify signals detected by photodiodes in the respective cells, and are characterized by having a high sensitivity.

FIG. 1 is a circuit diagram showing the arrangement of a conventional solid-state imaging apparatus using an amplification-type MOS sensor. Unit cells P0-i-j corresponding to pixels are arranged in the form of a two-dimensional matrix. Although FIG. 1 shows only a 3×3 matrix, the actual apparatus has several thousand cells× several thousand cells. Reference symbol i denotes a variable in the horizontal (row) direction; and j, a variable in the vertical (column) direction. Each unit cell P0-i-j is constituted by a photodiode 1-i-j for detecting incident light, an amplification transistor 2-i-j having a gate to which the cathode of the photodiode 1-i-j is connected and designed to amplify the detection signal, a vertical selection transistor 3-i-j connected to the drain of the amplification transistor 2-i-j to select a horizontal line for reading out the signal, and a reset transistor 4-i-j connected to the cathode of the photodiode 1-i-j to reset the signal charge. The source of the vertical selection transistor 3-i-j and the source of the reset transistor 4-i-j are commonly connected to a drain voltage terminal.

Vertical address lines 6-1, 6-2, . . . horizontally extending from a vertical address circuit 5 are connected to the gates of vertical selection transistors 3-1-1, . . . of the unit cells in the respective rows to determine horizontal lines for reading out signals. Similarly, reset lines 7-1, 7-2, . . . horizontally extending from the vertical address circuit 5 are connected to the gates of reset transistors 4-1-1, . . . in the respective rows.

The sources of amplification transistors 2-1-1, . . . of the unit cells in the respective rows are connected to vertical signal lines 8-1, 8-2, . . . arranged in the column direction. Each of load transistors 9-1, 9-2, . . . is connected to one end of a corresponding one of the vertical signal lines 8-1, 8-2, . . . . A signal output terminal (horizontal signal line) 15 is connected to the other end of each of the vertical signal lines 8-1, 8-2, . . . through horizontal selection transistors 12-1, 12-2, . . . which are driven by horizontal address pulses output from a horizontal address circuit 13.

FIG. 2 is a timing chart showing the operation of this device. When a high-level address pulse is applied to the vertical address line 6-1, only the vertical selection transistors 3 in this line are turned on. As a result, a source follower circuit is constituted by the amplification transistor 2 and the load transistor 9 in this line.

With this operation, the gate voltage of the amplification transistor 2, i.e., almost the same voltage as that of the photodiode 1, appears on the vertical signal line 8.

Horizontal address pulses are sequentially applied from the horizontal address circuit 13 to the horizontal selection transistors 12-1, 12-2, . . . to sequentially output signals corresponding to lines (rows) from the signal output terminal 15. When the signal corresponding to one line is completely read out, a high-level reset pulse is applied to the reset line 7-1 to turn on the reset transistor 4 in this line so as to reset the signal charge.

By sequentially performing this operation for the subsequent lines, all the signals in the two-dimensional matrix can be read out. In this case, a voltage corresponding to almost the same change in the potential of the photodiode 1 appears on the vertical signal line 8. If the capacitances of the photodiode 1 and the vertical signal line 8 are respectively represented by Cs and Cv, the signal charge is amplified Cv/Cs times. In general, Cv is much larger than Cs.

In a solid-state imaging apparatus using an amplification-type MOS sensor of this type, the following problem is posed. Since variations in the threshold voltages of the amplification transistors 64 are superimposed on signals, even if the potentials of the photodiodes 62 are the same, the output signals vary. For this reason, when a picked-up image is reproduced, two-dimensional noise (called fixed pattern noise because the noise is fixed to a specific place) due to the threshold variations of the amplification transistors 64 is generated.

As described above, in a solid-state imaging apparatus using an amplification-type MOS sensor, there is a problem in which the fixed pattern noise due to the threshold variations of the amplification transistors appears in the picked-up image.

It is an object of the present invention to provide an MOS-type solid-state imaging apparatus which suppresses the two-dimensional fixed pattern noise due to the threshold variation of the amplification transistors.

BRIEF SUMMARY OF THE INVENTION

According to the present invention, there is provided an MOS-type solid-state imaging apparatus comprising unit cells arranged in an array; means for selecting one of the unit cells, wherein each of the unit cells comprises a photoelectric converter; an amplification transistor having a gate to which the photoelectric converter is connected and for amplifying an output signal from the photoelectric converter and output an amplified signal; a selection transistor having a gate to which the selecting means is connected and for selectively turning on the amplification transistor; and a reset transistor connected between a connection point between the amplification transistor and the selection transistor and a gate of the amplification transistor for selectively resetting the gate of the amplification transistor.

According to the present invention, there is provided another MOS-type solid-state imaging apparatus comprising an imaging region having unit cells arranged in a two-dimensional matrix, each unit cell being constituted by a photodiode, an amplification transistor having a gate to which an output from the photodiode is input, a vertical selection transistor connected in series with the amplification transistor, and a reset transistor connected between the drain and gate of the amplification transistor to discharge the signal from the photodiode; vertical address lines connected to gates of the vertical selection transistors and arranged in a row direction; a vertical address circuit for driving the vertical address lines; vertical signal lines arranged in a column direction in which currents are read out from the amplification transistors; load transistors each connected to one end of a corresponding one of the vertical signal lines; horizontal selection transistors each connected to the other end of a corresponding one of the vertical signal lines; a horizontal address circuit for sequentially supplying selection pulse signals to gates of the horizontal selection transistors; and a horizontal signal line for reading out signal currents from the vertical signal lines through the horizontal selection transistors.

According to the present invention, there is provided a still another MOS-type solid-state imaging apparatus comprising an imaging region having unit cells arranged in a two-dimensional matrix, each unit cell being constituted by a photodiode, an amplification transistor having a gate to which an output from the photodiode is input, a vertical selection transistor connected in series with the amplification transistor, and a reset transistor connected between the drain and gate of the amplification transistor to discharge the signal from the photodiode; vertical address lines connected to gates of the vertical selection transistors and arranged in a row direction; a vertical address circuit for driving the vertical address lines; vertical signal lines arranged in a column direction in which currents are read out from the amplification transistors; load transistors each connected to one end of a corresponding one of the vertical signal lines; horizontal selection transistors each connected to the other end of a corresponding one of the vertical signal lines through a separation transistor; a hold capacitor connected in parallel with the other end of each of the vertical signal lines; a horizontal address circuit for sequentially applying selection pulse signals to gates of the horizontal selection transistors; and a horizontal signal line for reading out signal currents from the vertical signal lines through the horizontal selection transistors.

BRIEF DESCRIPTION OF THE SEVERAL VIEWS OF THE DRAWING

FIGS. 8A, 8B and 8C are views showing a principle of correcting the threshold variation of the amplification transistors in the unit cell according to the first embodiment;

DETAILED DESCRIPTION OF THE INVENTION

MOS-type solid-state imaging apparatuses according to the embodiments of the present invention will be described below with reference to the accompanying drawings.

First Embodiment

Figure 1:
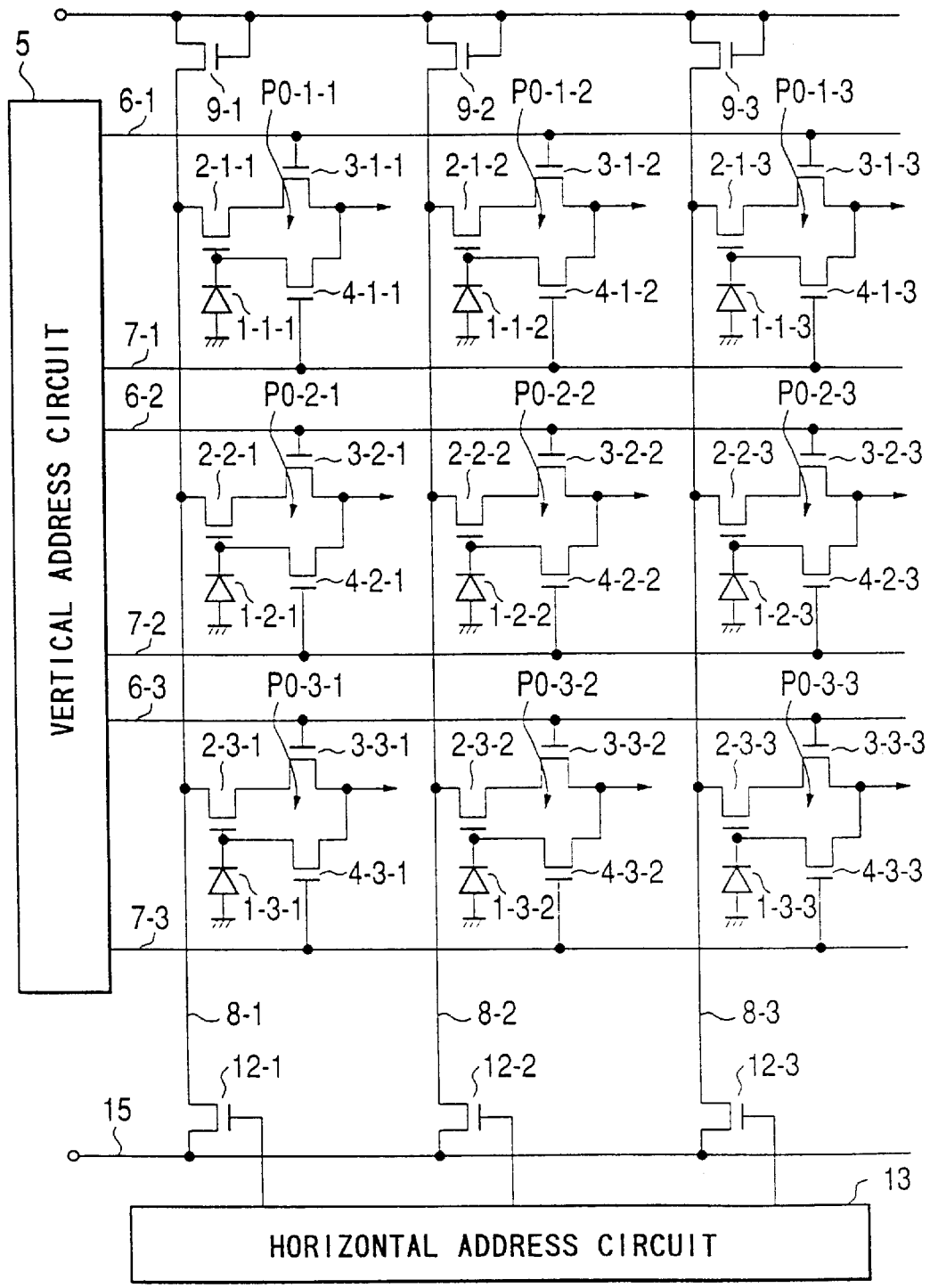
FIG. 1 is a circuit diagram showing the arrangement of a conventional MOS-type solid-state imaging apparatus.
Figure 2:
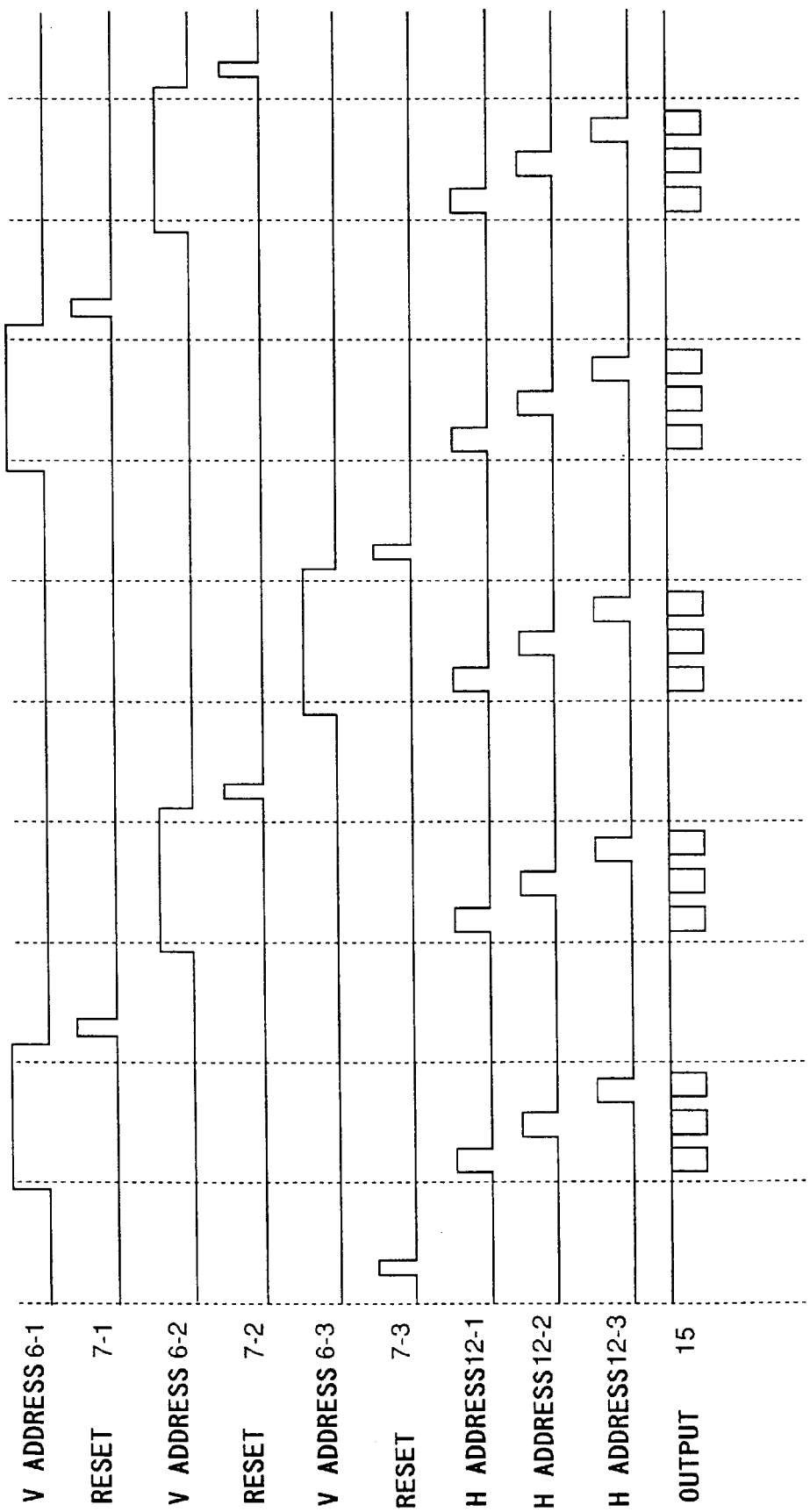
FIG. 2 is a timing chart showing the operation of the conventional apparatus shown in FIG. 1.
Figure 3:
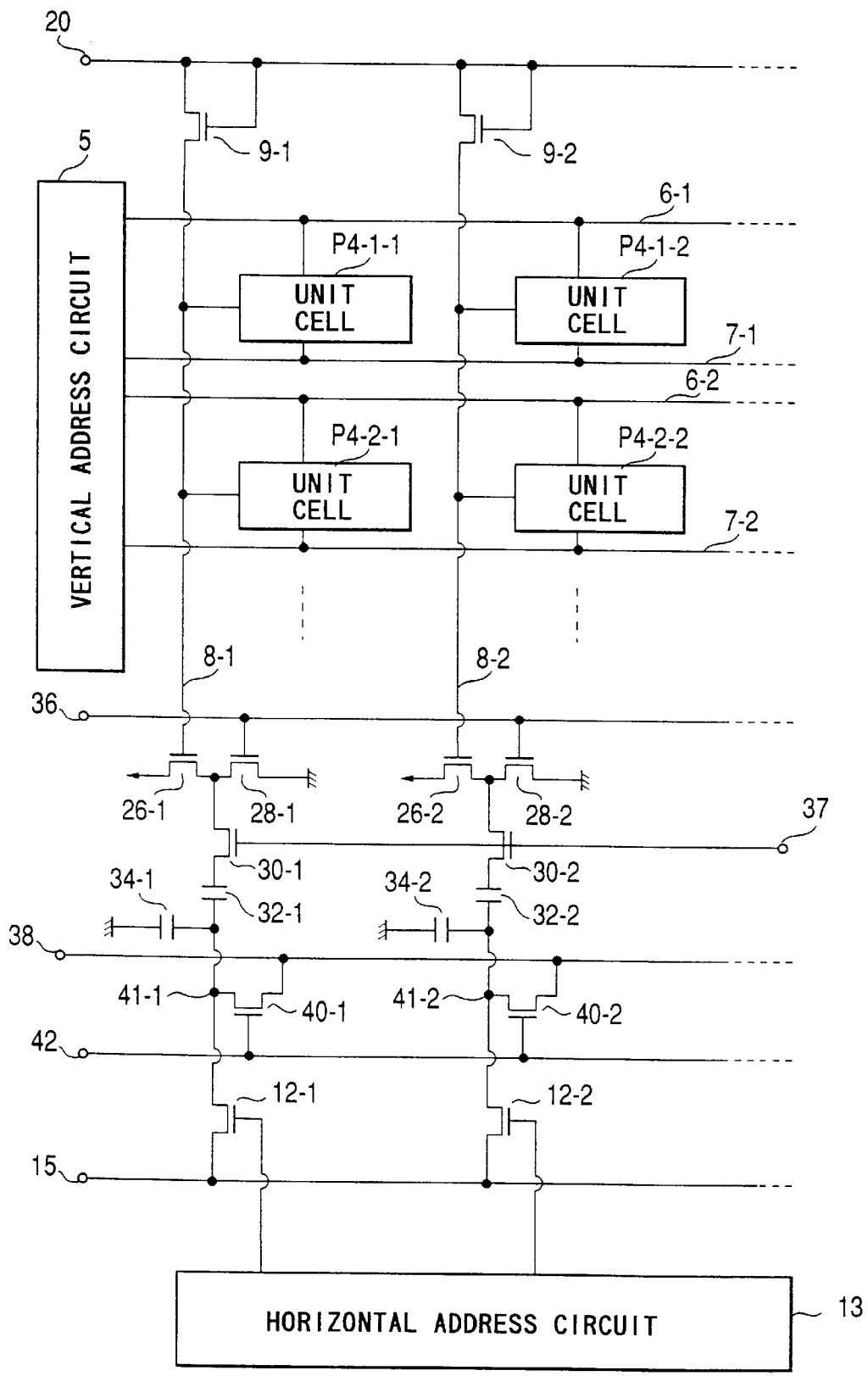
FIG. 3 is a circuit diagram showing the arrangement of an MOS-type solid-state imaging apparatus according to a first embodiment of the present invention.
Figure 7:
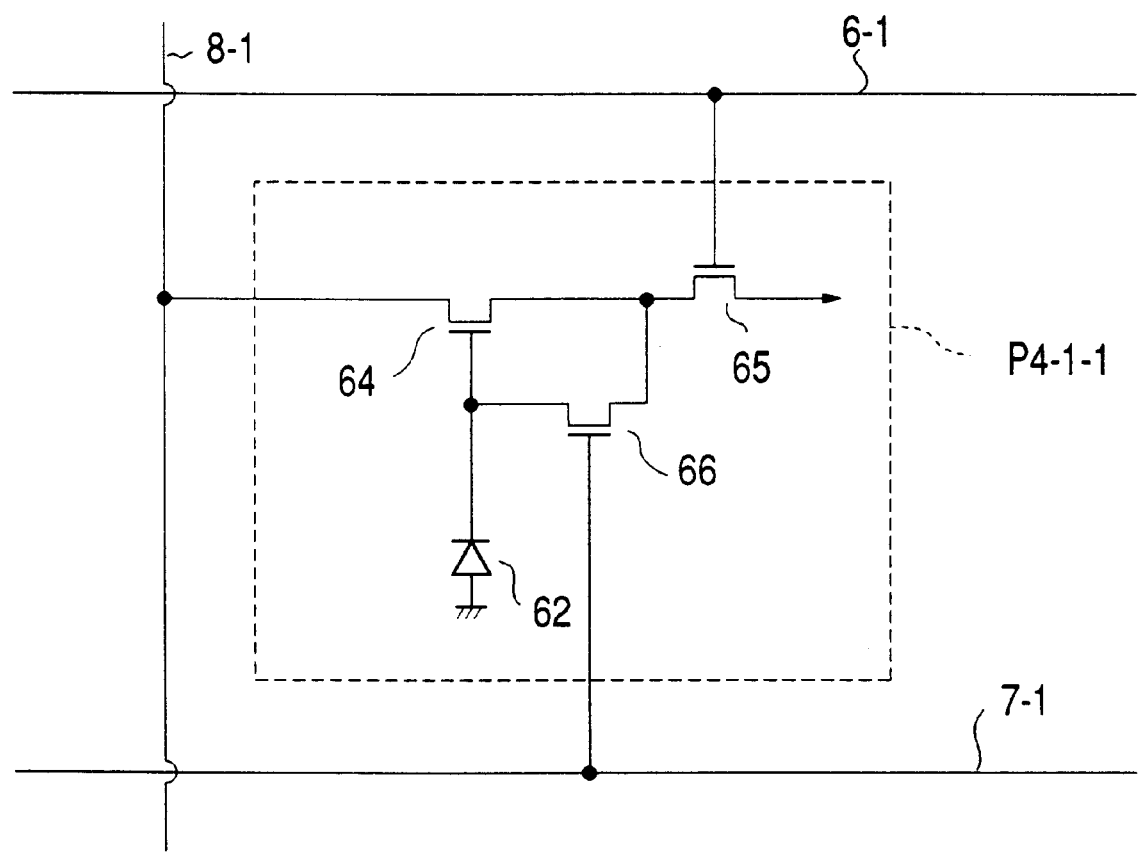
FIG. 7 is a timing chart showing the operation of the first embodiment.

FIG. 3 shows the arrangement of an MOS-type solid-state imaging apparatus according to a first embodiment of the present invention. Unit cells P4-i-j are arranged in the form of a two-dimensional matrix. Although FIG. 3 shows only a 2×2 matrix, the actual apparatus has several thousand cells× several thousand cells. Reference symbol i denotes a variable in the horizontal (row) direction; and j, a variable in the vertical (column) direction. The details of the unit cell P4-i-j is shown in FIG. 7.

The range of applications of the solid-state imaging apparatus of the present invention includes video cameras, electronic still cameras, digital cameras, facsimile apparatuses, copying machines, scanners, and the like.

Vertical address lines 6-1, 6-2, . . . horizontally extending from a vertical address circuit 5 are connected to the unit cells in the respective rows to determine horizontal lines for reading out signals. Similarly, reset lines 7-1, 7-2, . . . horizontally extending from the vertical address circuit 5 are connected to the unit cells in the respective rows.

The unit cells in the respective columns are connected to vertical signal lines 8-1, 8-2, . . . arranged in the column direction. Each of load transistors 9-1, 9-2, . . . is connected to one end of a corresponding one of the vertical signal lines 8-1, 8-2, . . . The gates and drains of the load transistors 9-1, 9-2, . . . are commonly connected to a drain voltage terminal 20.

The other end of each of the vertical signal lines 8-1, 8-2, . . . is connected to a gate of MOS transistors 26-1, 26-2, . . . Sources of the MOS transistors 26-1, 26-2, . . . are connected to drains of MOS transistors 28-1, 28-2, . . . The MOS transistors 26-1, 26-2, . . . and 28-1, 28-2, . . . operate as source follower circuits. The gates of the MOS transistors 28-1, 28-2, . . . are connected to a common gate terminal 36.

Connection points between the MOS transistors 26-1, 26-2, . . . and 28-1, 28-2, . . . are connected to one ends of clamp capacitors 32-1, 32-2, . . . through sample/hold transistors 300-1, 30-2, . . . Sample/hold capacitors 34-1, 34-2, . . . and clamp transistors 40-1, 40-2, . . . are connected in parallel to the other ends of the clamp capacitors 32-1, 32-2, . . . The other ends of the sample/hold transistors 300-1, 30-2, . . . are grounded. The other ends of the clamp capacitors 32-1, 32-2, . . . are connected to a signal output terminal (horizontal signal line)15 through a horizontal selection transistors 12-1, 12-2, . . .

Figures 4, 5:
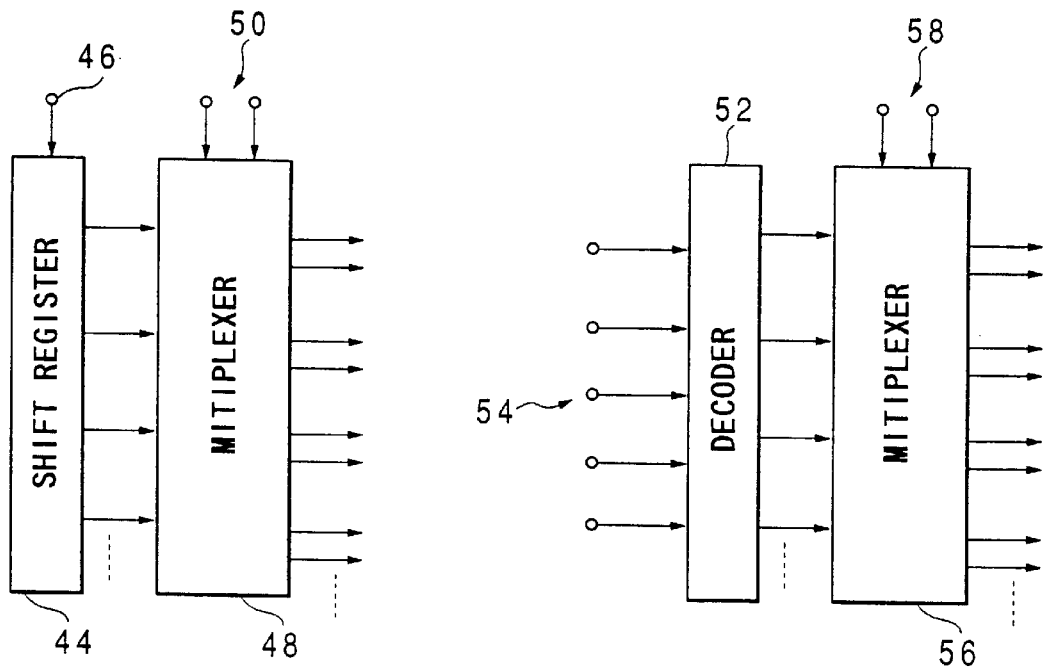
FIG. 4 is a view showing a circuit arrangement of a vertical address circuit in the first embodiment.
FIG. 5 is a view showing another circuit arrangement of the vertical address circuit in the first embodiment.
Figure 6:
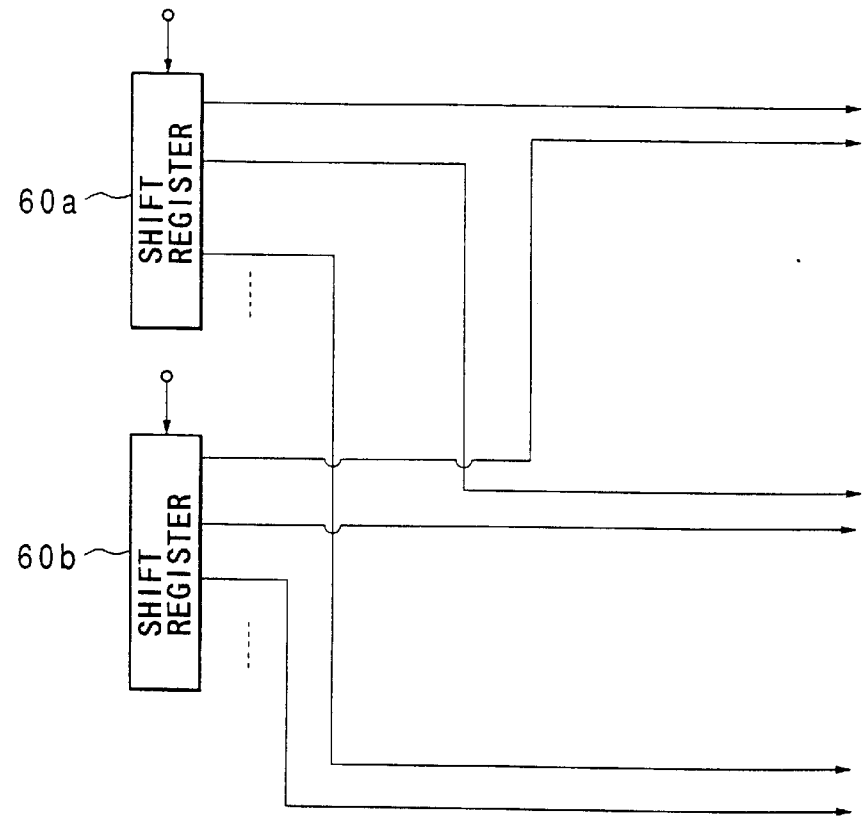
FIG. 6 a view showing still another circuit arrangement of the vertical address circuit in the first embodiment.

The vertical address circuit 5 is a circuit for shifting a plurality of signals, two signals in this case, together, and is realized by one of the circuits shown in FIGS. 4, 5, and 6. In the case shown in FIG. 4, outputs from many output terminals of a shift register 44 for sequentially shifting and outputting an input signal 46 are synthesized with two input signals 50 by a multiplexer 48. In the case shown in FIG. 5, outputs from a decoder 52 for decoding an encoded input 54 are synthesized with two input signals 58 by a multiplexer 56. In the case shown in FIG. 6, the outputs of two shift registers 60a and 60b are synthesized into control signal lines in the respective rows.

FIG. 7 shows an arrangement of the unit cell P4-i-j in FIG. 3. Although FIG. 7 shows only the arrangement of the unit cell P4-1-1, the same arrangement is used for each of the remaining unit cells P4-1-2, . . .

As shown in FIG. 7, each unit cell of the MOS-type solid-state imaging apparatus of this embodiment is constituted by a photodiode 62 for detecting incident light, an amplification transistor 64 having a gate to which the cathode of the photodiode 62 is connected and serving to amplify a detection signal from the photodiode 62, a reset transistor 66 arranged between the gate and drain of the amplification transistor 64 and serving to perform a feedback operation, and a vertical selection transistor 65 connected to the drain of the amplification transistor 64 to select a horizontal line from which a signal is to be read out.

The vertical address line 6-1 horizontally extending from the vertical address circuit 5 is connected to the gate of the vertical selection transistor 65 to select a line from which a signal is to be read out. Similarly, the reset line 7-1 horizontally extending from the vertical address circuit 5 is connected to the gate of the reset transistor 66.

In general, in the amplification-type MOS solid-state imaging apparatus, since variations in the threshold voltages of the amplification transistors 64 are superimposed on signals, even if the potentials of the photodiodes 62 are the same, the output signals vary. When a picked-up image is reproduced, therefore, two-dimensional noise (called fixed pattern noise because the noise is fixed to a specific place) corresponding to the threshold variations of the amplification transistors 64 is generated. For this reason, in this embodiment, the reset transistor 66 in each unit cell is caused to perform a feedback operation so as to reduce fixed pattern noise. In addition, a noise reduction circuit for further suppressing the reduced fixed pattern noise is arranged in a preceding stage of the horizontal selection transistor 12 in FIG. 3. FIG. 3 shows a correlation double sampling type noise reduction circuit for obtaining the difference between a signal and noise in a voltage domain. However, the noise reduction circuit is not limited to the correlation double sampling type, and various types of noise reduction circuits can be used.

The principle of threshold voltage correction performed for the amplification transistor 64 by the feedback operation of the unit cell, which is a characteristic feature of this embodiment, will be described first with reference to FIGS. 8A to 8C. FIG. 8A is a circuit diagram of the unit cell. FIGS. 8B and 8C are the potential charts of the amplification transistor 64. FIG. 8B shows the potential set when a reference voltage is applied to the vertical signal line 8 while the vertical selection transistor 65 is off, and the reset transistor 66 is on. As electrons flow into the drain through the gate channel, the drain voltage drops.

Since the drain-gate path is conductive due to the ON state of the reset transistor 66, the gate voltage also drops, and the number of electrons flowing into the drain decreases. Finally, as shown in FIG. 8C, the reference voltage applied to the source becomes almost equal to the channel potential. In this state, the channel potential is set to an external voltage, and no variations appear in terms of the structures of transistors.

As described above, according to this embodiment, threshold variations can be corrected by inserting the feedback transistor (reset transistor 66) between the gate and drain of the amplification transistor 64, and performing a feedback operation with a constant voltage being applied to the source.

Figure 9:
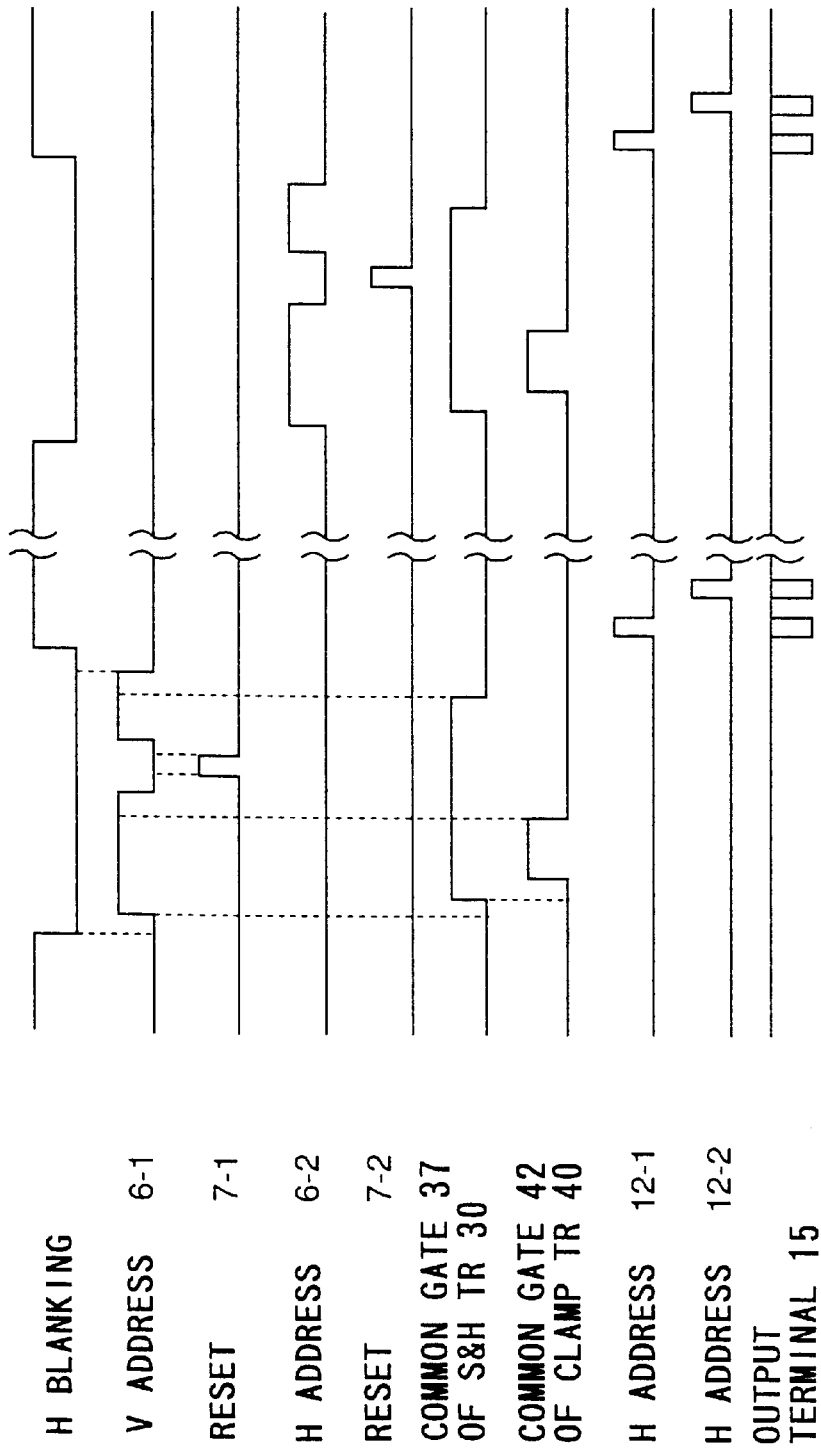
FIG. 9 is a timing chart showing the operation of the first embodiment.

The operation of the MOS-type solid-state imaging apparatus having the above arrangement will be described next with reference to the timing chart of FIG. 9. Since the common drain terminal 20 of the load transistors 9, the common gate terminal 36 of the transistors 28 of impedance converters, and the common source terminal 38 of clamp transistors 40 are DC-driven, their operations are omitted from the timing chart.

When a high-level address pulse is applied to the vertical address line 6-1, the vertical selection transistors 65 of the unit cells P4-1-1, P4-1-2, . . . connected to the vertical address line 6-1 are turned on. As a result, source follower circuits are constituted by the amplification transistors 64 and the load transistors 9-1, 9-2, . . .

The common gate 37 of the sample/hold transistors 30-1, 30-2, . . . is set at high level to turn on the sample/hold transistors 30-1, 30-2, . . . Thereafter, the common gate 42 of the clamp transistors 40-1, 40-2, . . . is set at high level to turn on the clamp transistors 40-1, 40-2, . . .

Subsequently, the common gate 42 of the clamp transistors 40-1, 40-2, . . . is set at low level to turn off the clamp transistors 40-1, 40-2, . . . With this operation, the signals plus noise components appearing on the vertical signal lines 8-1, 8-2, . . . are stored in the clamp capacitors 32-1, 32-2, . . .

When a high-level reset pulse is applied to the reset line 7-1 after the vertical address pulse is returned to low level, the reset transistors 66 of the unit cells P4-1-1, P4-1-2, connected to the reset line 7-1 are turned on. As a result, the charge at the input terminal of an output circuit 68 is reset.

When a high-level address pulse is applied to the vertical address line 6-1 again, the vertical selection transistors 65 of the unit cells P4-1-1, P4-1-2, . . . connected to the vertical address line 6-1 are turned on, and source follower circuits are constituted by the amplification transistors 64 and the load transistors 9-1, 9-2, . . . As a result, only the noise components obtained after the signal components are reset appear on the vertical signal lines 8-1, 8-2, . . .

As described above, since the signals plus noise components are stored in the clamp capacitors 32-1, 32-2, . . . , voltage changes on the vertical signal lines 8-1, 8-2, . . . , i.e., only the signal voltages without fixed pattern noise, obtained by subtracting the noise components from the signal components plus noise components, appear on the clamp nodes 41-1, 41-2, . . .

The common gate 37 of the sample/hold transistors 30-1, 30-2, . . . is set at low level to turn off the sample/hold transistors 30-1, 30-2, . . . With this operation, the voltages without noise, appearing on the clamp nodes 41-1, 41-2, . . . , are stored in the sample/hold capacitors 34-1, 34-2, . . .

By sequentially applying a horizontal address pulse to the horizontal selection transistors 12-1, 12-2, . . . , the signals from the photodiodes 62, which are stored in the sample/hold capacitors 34-1, 34-2, . . . and contain no noise, are read out from the output terminal (horizontal signal line) 15.

By repeating the above operation for the vertical address lines 6-2, 6-3, . . . in the same manner as described above, the signals in all the cells arranged two-dimensionally can be output.

A sequence in the timing chart of FIG. 9 will be described below. The following two sequences are required:

(1) Rise of sample/hold pulse→Fall of clamp pulse→Fall of first vertical address pulse→Fall of reset pulse→Rise of second vertical address pulse→Fall of sample/hold pulse→Fall of second vertical address pulse (2) Fall of clamp pulse→Rise of reset pulse→Fall of reset pulse Although the order of the rise of the first vertical address pulse, the rise of the sample/hold pulse, and the rise of the clamp pulse can be arbitrarily set, the above order is preferable. Although the order of the fall of the first vertical address pulse and the rise of the reset pulse can be arbitrarily set, the above order is preferable.

As described above, according to the operation in FIG. 9, since a voltage corresponding to the difference between the voltage set when a signal (plus noise) is present and the voltage set when the gate of the amplification transistor is reset and no signal is present, appears on the clamp node 41, fixed pattern noise caused by threshold variation of the amplification transistors 64, which cannot be completely removed by the feedback operation of the unit cell for some reason, is compensated. That is, a circuit constituted by the clamp transistor 30, the clamp capacitor 31, the sample/hold transistor 40, and the sample/hold capacitor 34 serves as a noise canceler.

Note that the noise canceler in this embodiment is connected to the vertical signal line 8 through the impedance converter 26 and 28 constituted by a source follower circuit. That is, the vertical signal line is connected to the gate of the transistor 26. Since this gate capacitor is very small, the amplification transistor 64 of the unit cell charges only the vertical signal line 8-1, 8-2, . . . For this reason, the time constant of each CR circuit is small, and a steady state is quickly set. The application timing of a reset pulse can therefore be quickened to perform a noise canceling operation within a short period of time. When a television signal is to be handled, a noise canceling operation must be performed in a horizontal blanking interval. The ability to perform accurate noise cancellation within a short period of time is a great advantage. In addition, since the impedance of the noise canceler apparently remains the same, viewing from the unit cell, in a signal pulse noise output operation and in a noise output operation included in a noise canceling operation, noise can be accurately canceled.

The structure of this embodiment will now be described.

As is apparent from the circuit arrangement shown in FIG. 3, since the clamp capacitors 32 and the sample/hold capacitors 34 are directly connected to each other and arranged near, they can be stacked on the same surface. The size of each noise canceler portion can therefore be reduced.

Figure 10:
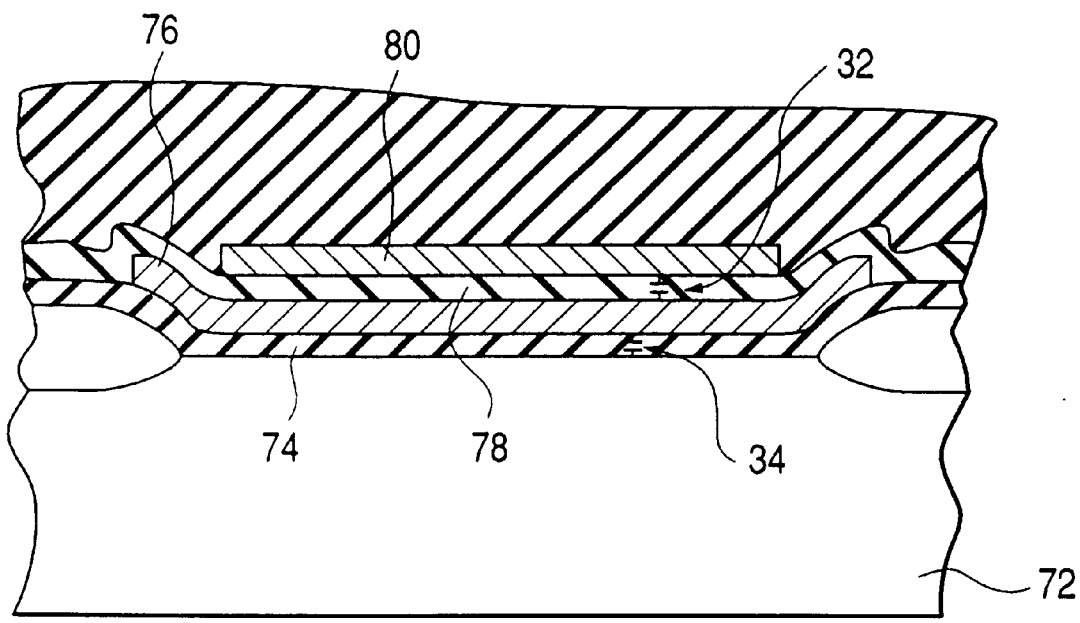
FIG. 10 is a sectional view showing the device structure of a noise canceler in the first embodiment.

More specifically, as shown in FIG. 10, a first electrode 76 is formed on a silicon substrate 72 through a first insulating film 74 to form the sample/hold capacitor 34. In addition, a second electrode 80 is formed on the first electrode 76 through a second insulating film 78 to form the clamp capacitor 32.

As is also obvious from FIG. 10, since the first electrode 76 serves as a common electrode, and the clamp capacitor 32 and the sample/hold capacitor 34 are stacked on each other, the same capacitance value as that obtained when these components are formed separately can be obtained with ½ the area.

In this embodiment, the unit cells P4-1-1, P4-1-2, . . . and peripheral circuits such as the vertical address circuit 5 and the horizontal address circuit 13 are formed on a semiconductor substrate having a $p_+$-type impurity layer formed on a $p^-$-type substrate.

Figures 11A, 11B:
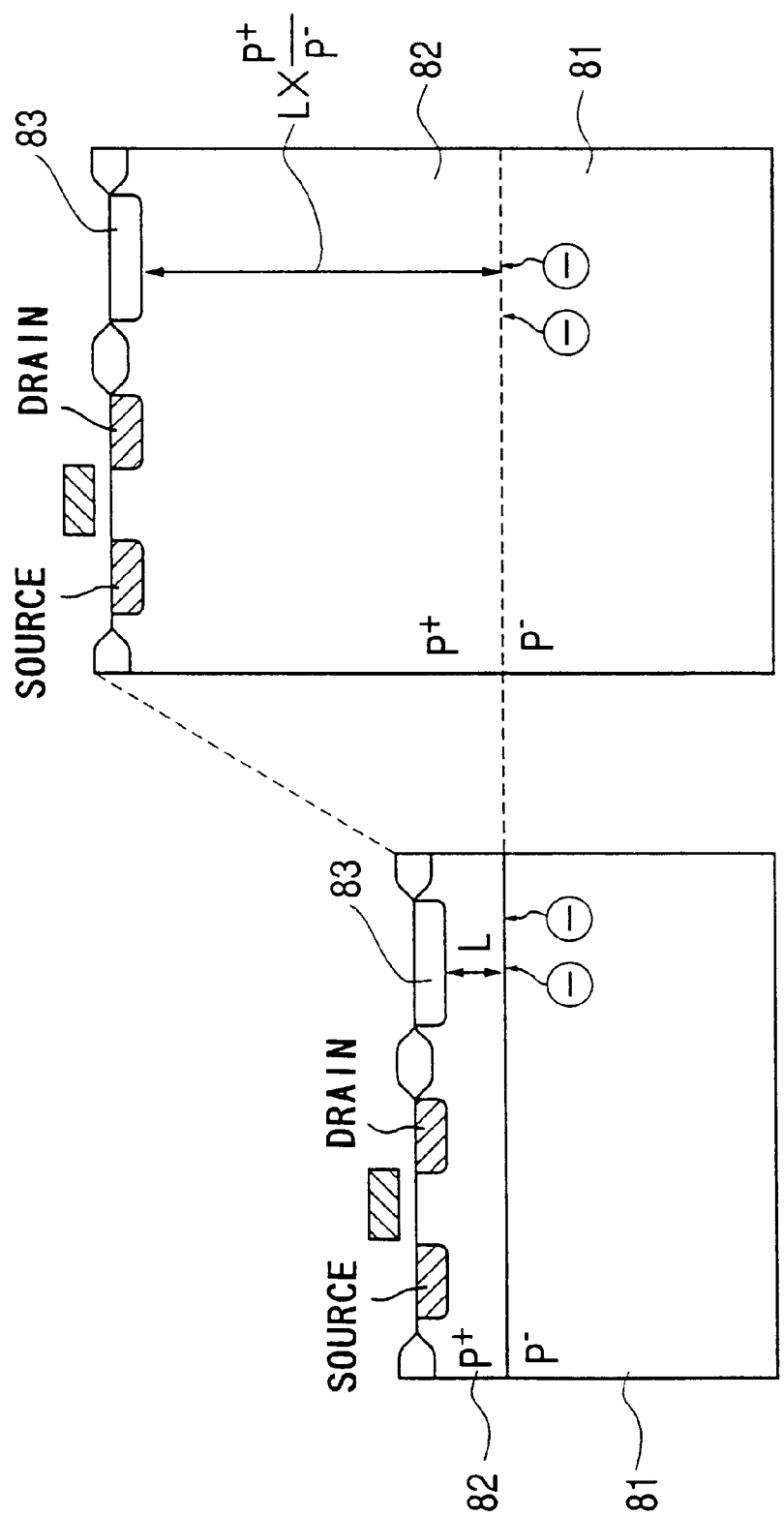
FIGS. 11A and 11B are sectional views showing the device structure of the unit cell in the first embodiment.

FIGS. 11A and 11B are sectional views showing such a semiconductor substrate.

As shown in FIG. 11A, cell elements such as photodiodes 83 are formed on a semiconductor substrate having a $p^+$-type impurity layer 82 formed on a $p^-$-type substrate 81.

With this structure of the semiconductor substrate, the diffusion potential at the $p^-/p^+$ boundary can partly prevent a dark current generated in the p⁻-type substrate 81 from flowing to the p⁺ layer side.

The result of a detailed analysis of the flows of electrons will be briefly described below. Apparently, a thickness L of the p⁺-type impurity layer 82 is increased by p⁺/p⁻ concentration ratio times, i.e., to L·p⁺/p⁻, from the viewpoint of an electron generated on the p⁻ side.

As shown in FIG. 11B, apparently, the distance from the p⁻-type substrate 81 as a dark current source to the photodiode 83 is increased p⁺/p⁻ times. In addition to the dark current flowing from a deep part of the substrate, a dark current is generated in a depletion layer near the photodiode 83. This dark current generated in the depletion layer is almost equal in magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a substrate. The reason why these dark currents are almost equal in magnitude regardless of this thickness difference is that the probability of occurrence of a dark current per unit volume is higher in the depletion layer. In this case, since the dark current generated in the depletion layer cannot be theoretically separated from a signal current, the dark current is reduced by reducing a component flowing from the deep part of the substrate.

In addition, since cells are formed on the semiconductor substrate having the p⁺-type impurity layer 72 formed on the p⁻-type substrate 71, variations in substrate potential due to the dark current can be prevented. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller than the component generated in the depletion layer. More specifically, it suffices if the dark current from the deep part of the substrate is about 1/10 or less of the dark current from the depletion layer. That is, p⁺/p⁻ may be set to 10 to set the component from the deep part of the substrate to about 1/10.

In a semiconductor substrate constituted by an n-type substrate and a p-type well, there is almost no dark current from a deep part of the substrate. To set the dark current to the same level as in such a semiconductor substrate, p⁺/p⁻ must be set to 100 to set the dark current from the deep part of the substrate to about 1/100.

In a conventional practical CCD, the impurity concentration of an n-type buried channel is about $10^{16}$ cm⁻³, and the impurity concentration of a p-type layer (p-type substrate in this case) surrounding the buried channel, which is set to stably manufacture the diffusion layer of the buried channel, is about $10^{15}$ cm⁻³.

When p⁺/p⁻ is set to 10, the impurity concentration of the p⁺-type layer becomes about $10^{16}$ cm⁻³. When p⁺/p⁻ is set to 100, the impurity concentration of the p⁺-type layer becomes about $10^{17}$ cm⁻³. That is, the impurity concentration of the p⁺-type layer becomes almost equal to that of the n-type buried channel, i.e., about $10^{16}$ cm⁻³, or becomes higher than that by one order in magnitude.

For this reason, in a conventional practical CCD, the use of a p⁺-type layer having such an impurity concentration has not been considered. If the impurity concentration of the p⁻-type layer is decreased, the sheet resistance of the substrate undesirably increases.

In contrast to this, in an amplification-type MOS imaging apparatus, since the buried channel of a CCD is not formed, the value of p⁺/p⁻ can be arbitrarily set to a certain degree without decreasing the impurity concentration of the p⁻-type layer.

Cells can also be formed by improving the structure of a semiconductor substrate constituted by an n-type substrate and a p-type well by decreasing the resistance of the p-type well.

Figure 12:
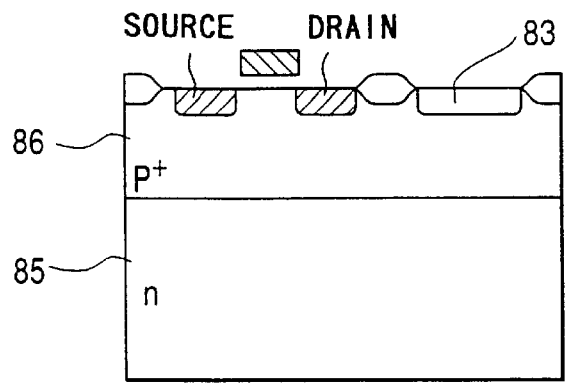
FIG. 12 is a view showing a modification of the semiconductor substrate of a portion of the unit cell in the first embodiment.
Figure 13:
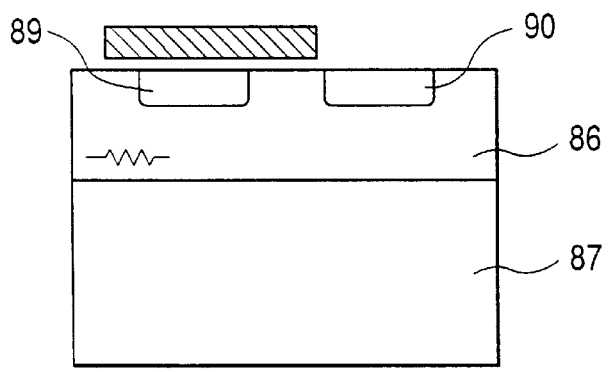
FIG. 13 is a sectional view showing a conventional cell of a CCD-type solid-state imaging apparatus.

FIG. 12 is a sectional view showing a unit cell using a p⁺-type well 86 having a low sheet resistance on an n-type substrate 85. FIG. 13 is a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm⁻³, about $10^{15}$ cm⁻³, and about $10^{16}$ cm⁻³.

Since the impurity concentration of an n-type photodiode 90 can be arbitrarily set to a certain degree, no many limitations are imposed in terms of manufacture. With the above impurity concentrations, the sheet resistance of the p⁺-type well 86 is about 100 kΩ/□. As described above, with such a large value, the noise caused in the CCD is very small.

When a noise reduction circuit is to be used in an amplification-type MOS imaging apparatus, the sheet resistance of the p-type well is very important. This is because, the time taken to suppress disturbances in the potential of the p-type well 86 due to a reset pulse needs to match a system to which this apparatus is to be applied.

According to the NTSC scheme, which is the existing television scheme, the noise reduction circuit is operated in an interval of about 11 [μs], which is a horizontal blanking interval. Disturbances in the potential of the p-type well 86 must be suppressed to about 0.1 [mV] within this interval.

Such a small value as 0.1 [mV] is set because the noise voltage output of the CCD corresponds to this. According to a detailed analysis, to settle the disturbances to a value as small as 0.1 [mV] within the very short time interval of 11 [μs], the sheet resistance of the p⁺-type well 86 must be set to 1 kΩ/□ or less. This is about 1/100 the sheet resistance of the conventional CCD.

For this purpose, the impurity concentration of the p⁺-type well 86 must be increased to about 100 times. Such a concentration cannot be set in the CCD, as described above with reference to the p-type substrate. Furthermore, in the high-vision television scheme, the horizontal blanking interval is 3.77 [μs], and hence the sheet resistance of the p⁺-type well 86 must be set to 300 kΩ/□ or less.

As another modification, a semiconductor substrate may be obtained by forming a heavily doped p⁺-type sandwich layer on a substrate, and forming a lightly doped p-type layer on the surface of the sandwich layer.

Figure 14:
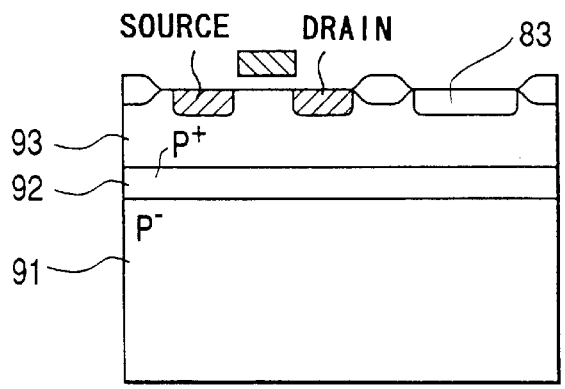
FIG. 14 is a view showing another modification of the semiconductor substrate of the portion of the unit cell in the first embodiment.
Figure 15:
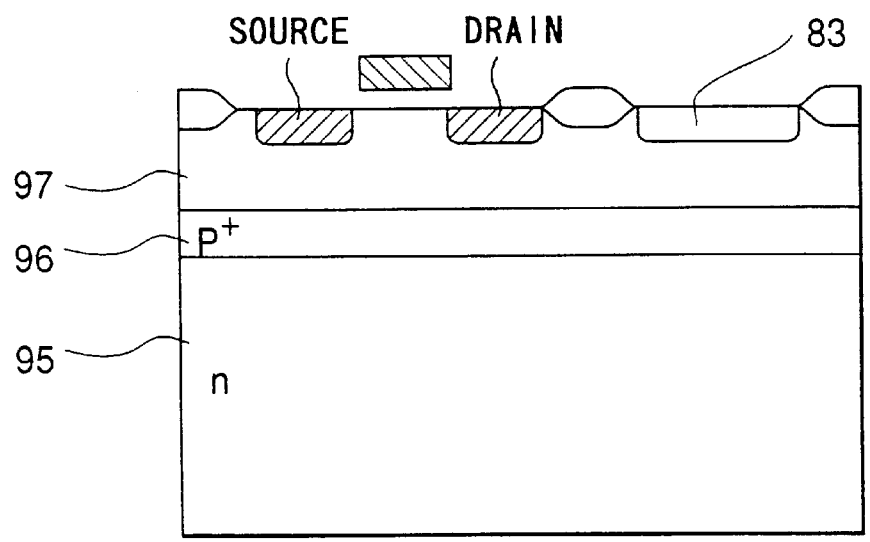
FIG. 15 is a view showing still another modification of the semiconductor substrate of the portion of the unit cell in the first embodiment.

FIG. 14 shows the structure of a semiconductor substrate having a p⁺-type sandwich layer 92 formed between a p⁻-type substrate 91 and a p-type layer 93. FIG. 15 shows a semiconductor substrate having a p⁺-type sandwich layer 96 formed between an n-type substrate 95 and a p-type layer 97.

Such a p⁺-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

Figure 16:
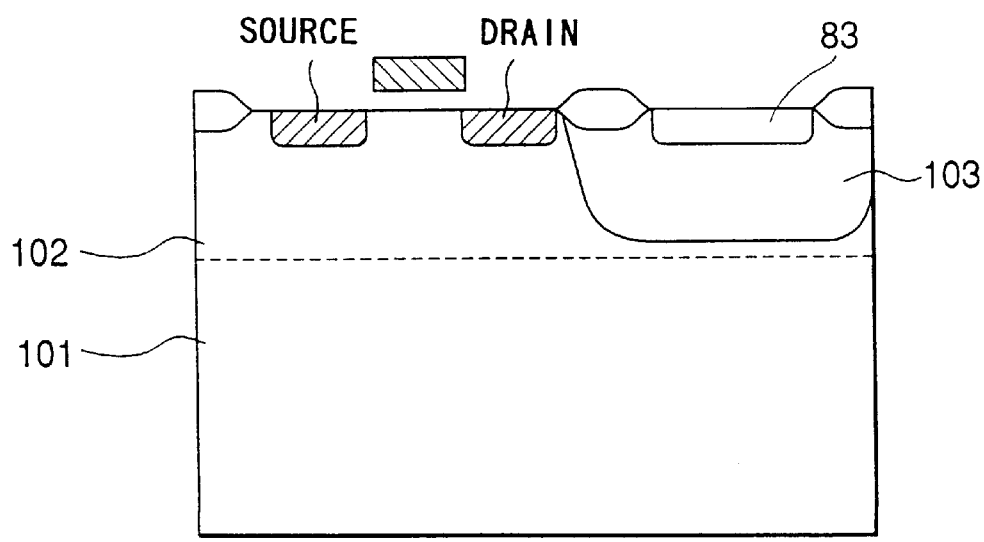
FIG. 16 is a view showing still another modification of the semiconductor substrate of the portion of the unit cell in the first embodiment.

FIG. 16 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a p⁻-type substrate.

The impurity concentration of the p-type well, which forms some or all of the horizontal and vertical address circuits around the cell, is determined in terms of circuit design, and differs from the optimum value of the cell. For this reason, a p-type layer may be formed independently of the p-type well which forms the imaging region.

Figure 17:
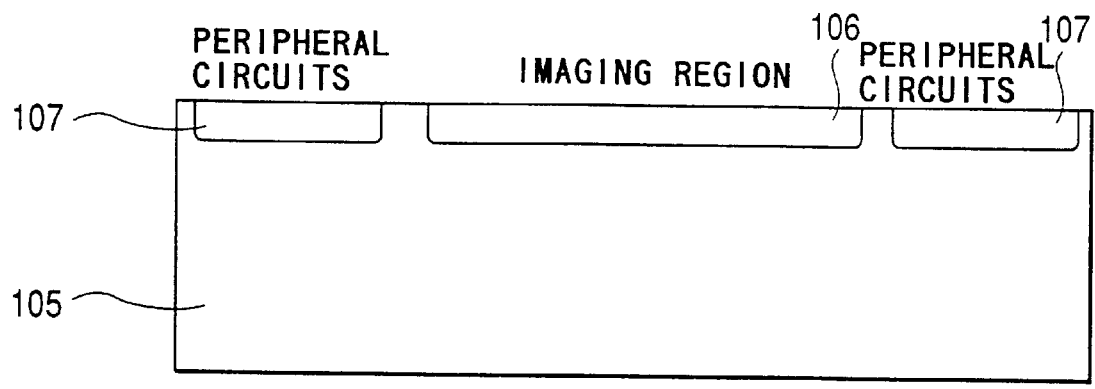
FIG. 17 is a view showing still another modification of the semiconductor substrate of the portion of the unit cell in the first embodiment.

FIG. 17 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a p⁻-type substrate.

Figure 18:
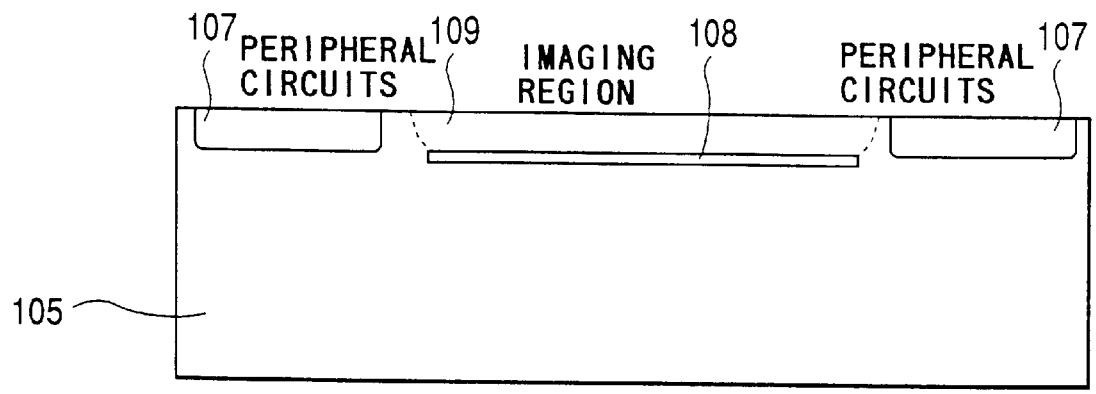
FIG. 18 is a view showing still another modification of the semiconductor substrate of the portion of the unit cell in the first embodiment.

FIG. 18 shows a structure in which a p⁺-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a p⁻-type substrate.

As described above, according to this embodiment, the source of the amplification transistor 64 is directly connected to the vertical address line 6, and the address capacitor 69 is inserted between the vertical address line 6 and the gate of the amplification transistor 64 instead of a vertical selection transistor. With this structure, the addressed amplification transistor 64 can be turned on, and only its gate potential can be output through the vertical signal line 8. That is, the vertical address line can be addressed without using any vertical selection transistor, and hence a reduction in cell size can be attained.

In addition, since an output from each unit cell is output through the noise canceler, fixed pattern noise due to threshold variations of the amplification transistor of each unit cell can be suppressed.

Furthermore, as a semiconductor substrate on which unit cells are formed, a substrate constituted by a p⁻-type impurity substrate and a p⁺-type impurity layer formed thereon is used to reduce a dark current flowing into each unit cell. In addition, since the potential at the substrate surface can be stabilized, the noise reduction circuit can be reliably operated.

Embodiments in which the noise canceler circuit portion of the first embodiment is modified will be described next.

Second Embodiment

Figure 19:
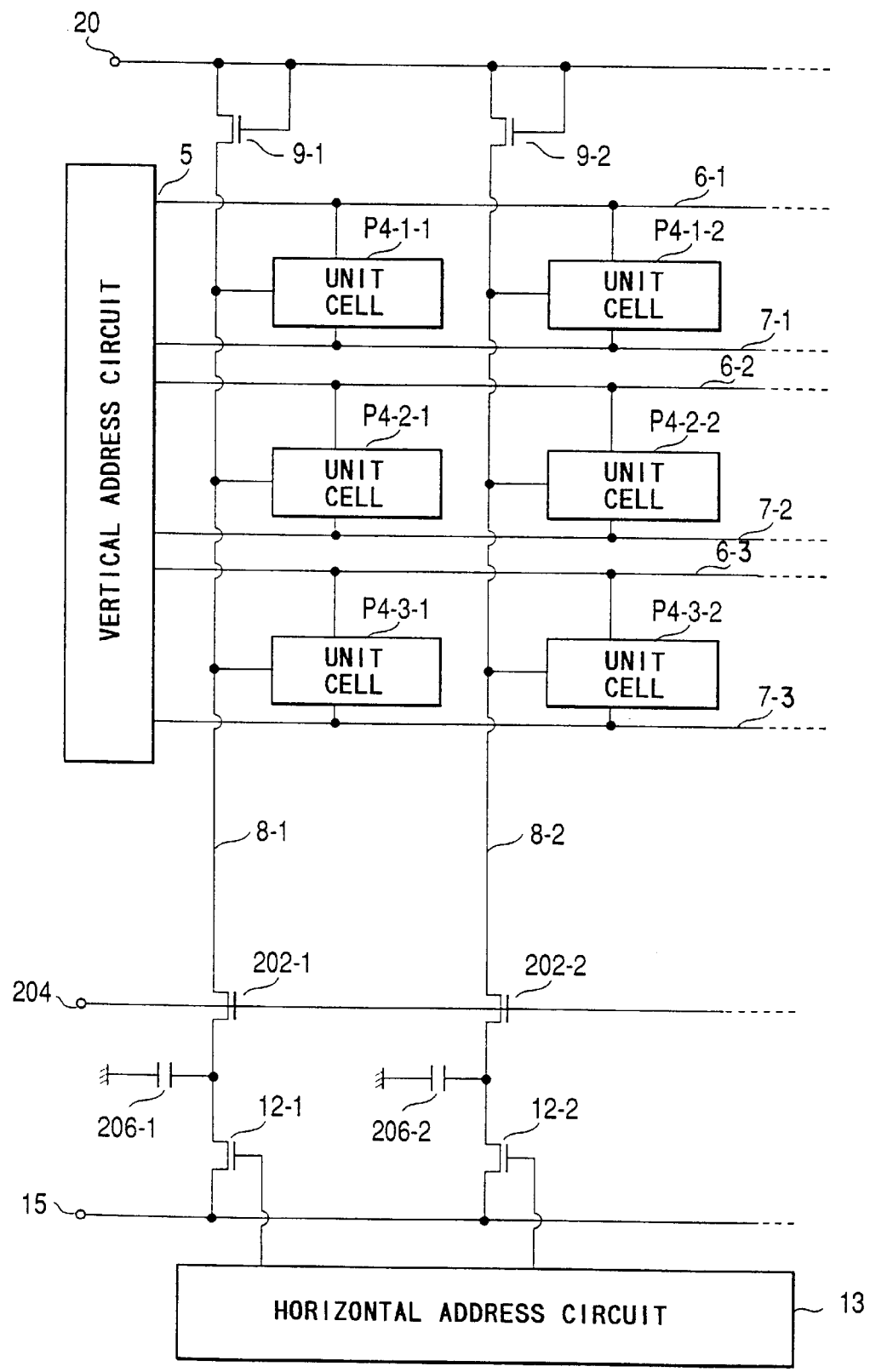
FIG. 19 is a circuit diagram showing the arrangement of an MOS-type solid-state imaging apparatus according to a second embodiment of the present invention.

FIG. 19 is a circuit diagram showing the arrangement of an imaging apparatus using an amplification-type MOS sensor according to the second embodiment of the present invention. The circuit arrangement of each unit cell P4-i-j is the same as that in the first embodiment.

Separation transistors 202-1, 202-2, . . . are connected in series with the vertical signal lines 8-1, 8-2, . . . Amplification capacitors 206-1, 206-2, . . . are arranged between the separation transistors 202-1, 202-2, . . . and the horizontal selection transistors 12-1, 12-2, . . . In this embodiment, no noise cancelers are arranged in the preceding stage of the horizontal selection transistors, but amplification capacitors for adjusting amplification factors are arranged instead.

Figure 20:
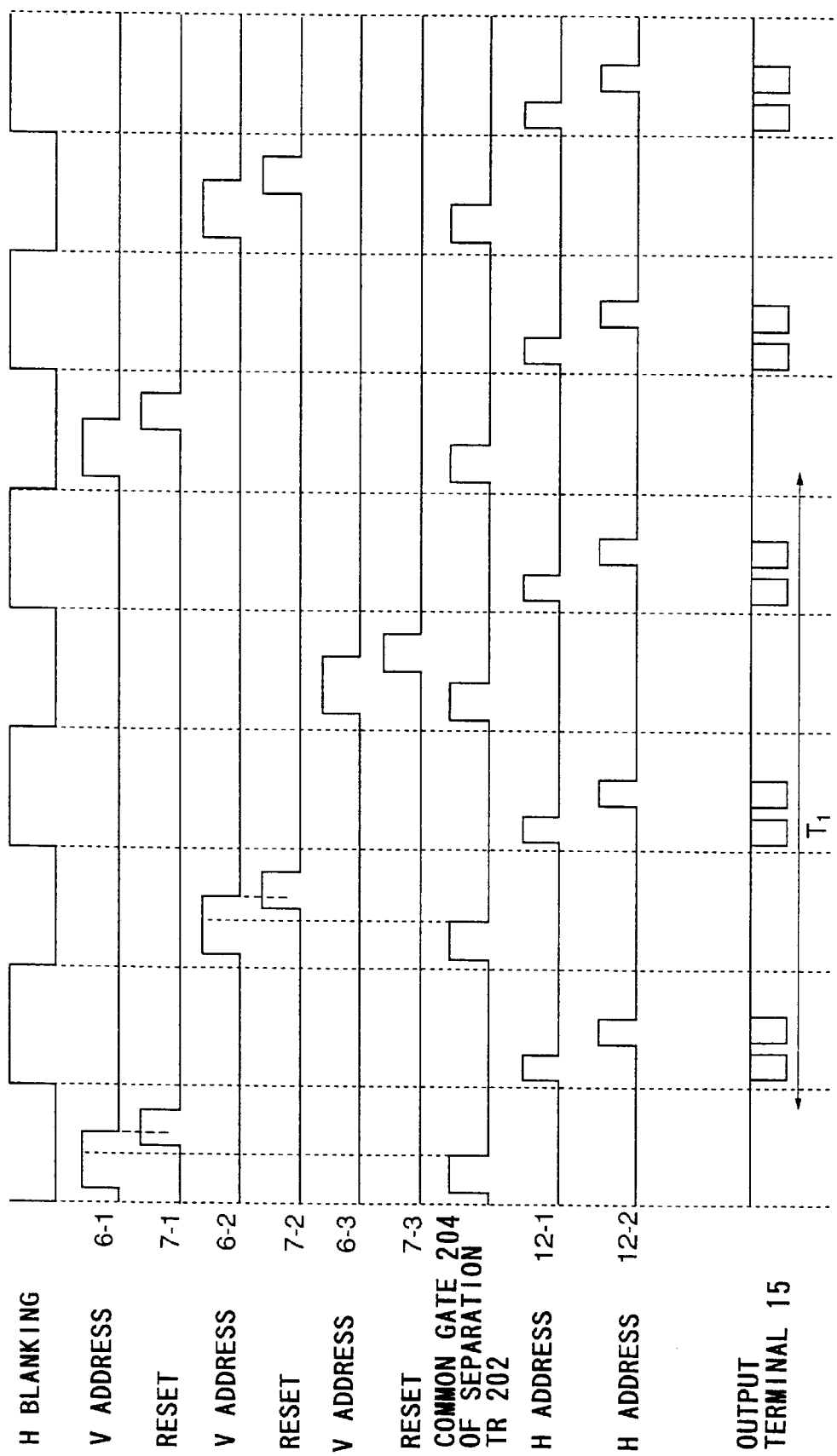
FIG. 20 is a timing chart showing the operation of the second embodiment.

The operation of this embodiment will be described with reference to FIG. 20.

A high-level address pulse is applied to the vertical address line 6-1, and at almost the same time, a high-level pulse is applied to the common gate 204 of the separation transistors 202 to turn on the separation transistors. With this operation, outputs from the amplification transistors 64 of the unit cells are transferred to the amplification capacitors 206 through the vertical signal lines 8, and the amplified signal charges are stored therein.

Subsequently, the common gate 204 of the separation transistors 202 is returned to low level to turn off the separation transistors 202.

A reset pulse is applied to the reset line 7-1 to turn on the reset transistors 66. The vertical address line 6-1 is then returned to low level to turn off the vertical selection transistor 65. As a result, the channel potential of each amplification transistor 64 becomes equal to the reference voltage. Thereafter, horizontal selection transistors 12 are sequentially turned on to sequentially read out the amplified signal voltages stored in amplification capacitors 206.

Letting Ca be the capacitance value of the amplification capacitor 206, and Cs be the capacitance value of the photodiode 62, the amplification factor of the signal charge at this time is given by Ca/Cs. To set the amplification factor to be equal to or higher than that in the conventional apparatus, the value of Ca is set to be equal to or larger than the capacitance Cv of the vertical signal line 8.

A sequence in the timing chart of FIG. 20 will be described below. The following two sequences are required:

(1) Rise of vertical address pulse→Fall of gate pulse for separation transistor→Rise of reset pulse→Fall of vertical address pulse→Fall of reset pulse (2) Rise of gate pulse for separation transistor→Fall of gate pulse for separation transistor→Rise of reset pulse→Fall of reset pulse Although the order of the rise of the vertical address pulse and the rise of the gate pulse for the separation transistor can be arbitrarily set, the above order is preferable.

Third Embodiment

Figure 21:
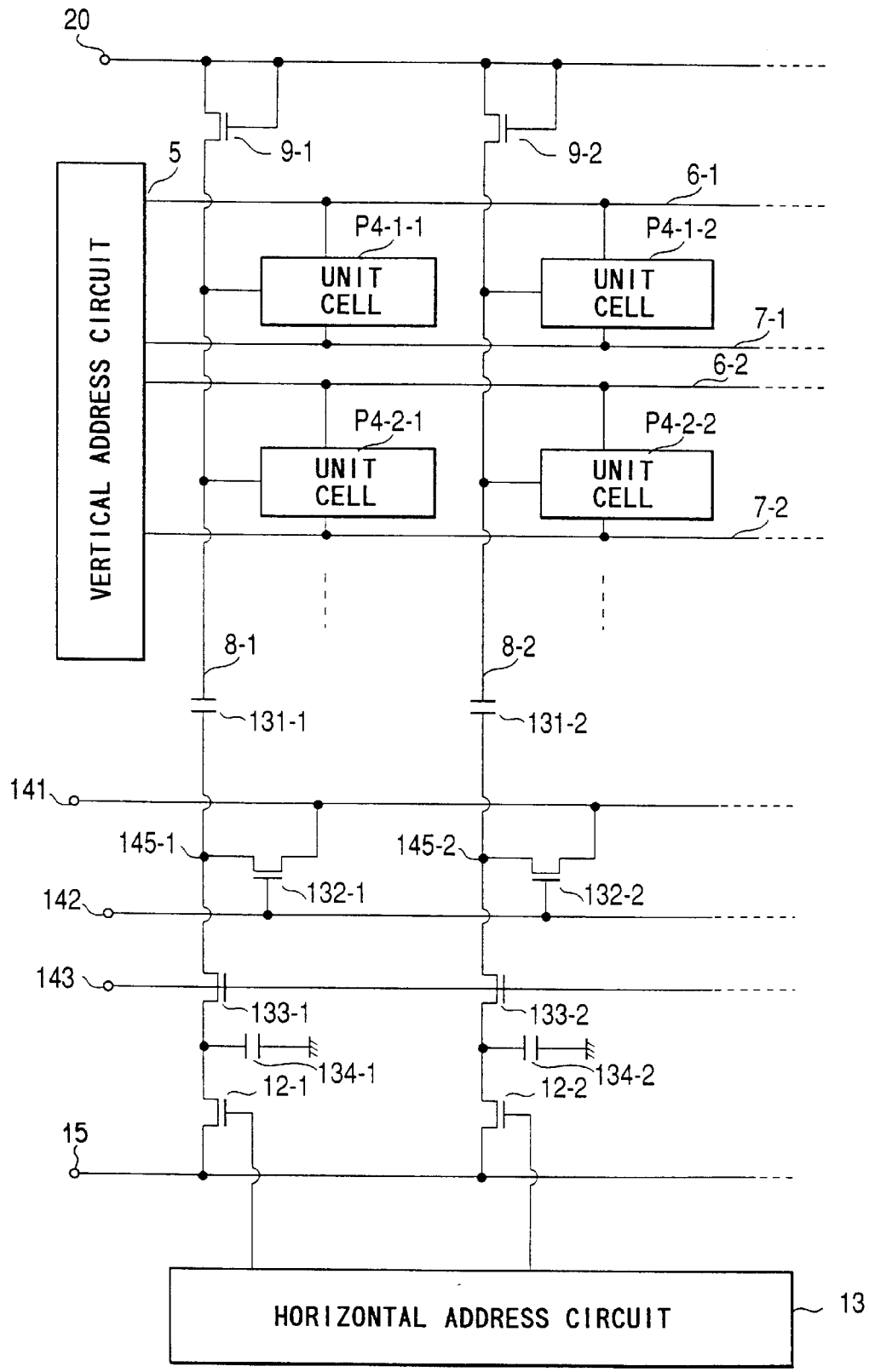
FIG. 21 is a circuit diagram showing the arrangement of an MOS-type solid-state imaging apparatus according to a third embodiment of the present invention.

FIG. 21 is a circuit diagram showing the arrangement of an imaging apparatus using an amplification-type MOS sensor according to the third embodiment of the present invention. The circuit arrangement of each unit cell P4-i-j is the same as that in the first embodiment.

The other end of each of vertical signal lines 8-1, 8-2, . . . is connected to the signal output terminal (horizontal signal line) 15 through a corresponding one of clamp capacitors 131-1, 131-2, . . . , a corresponding one of sample/hold transistors 133-1, 133-2, . . . , and a corresponding one of the horizontal selection transistors 12-1, 12-2, . . . The drains of the clamp transistors 132-1, 132-2, . . . are connected to the connection points (clamp nodes 145-1, 145-2, . . . ) between the clamp capacitors 131-1, 131-2, . . . and the sample/hold transistors 133-1, 133-2, . . . The sources of the clamp transistors 132-1, 132-2, . . . are connected to a common source terminal 141. The gates of the clamp transistors 132-1, 132-2, . . . are connected to a common gate terminal 142. The connection points between the sample/hold transistors 133-1, 133-2, . . . and the horizontal selection transistors 12-1, 12-2, . . . are grounded through sample/hold capacitors 134-1, 134-2, . . .

Figure 22:
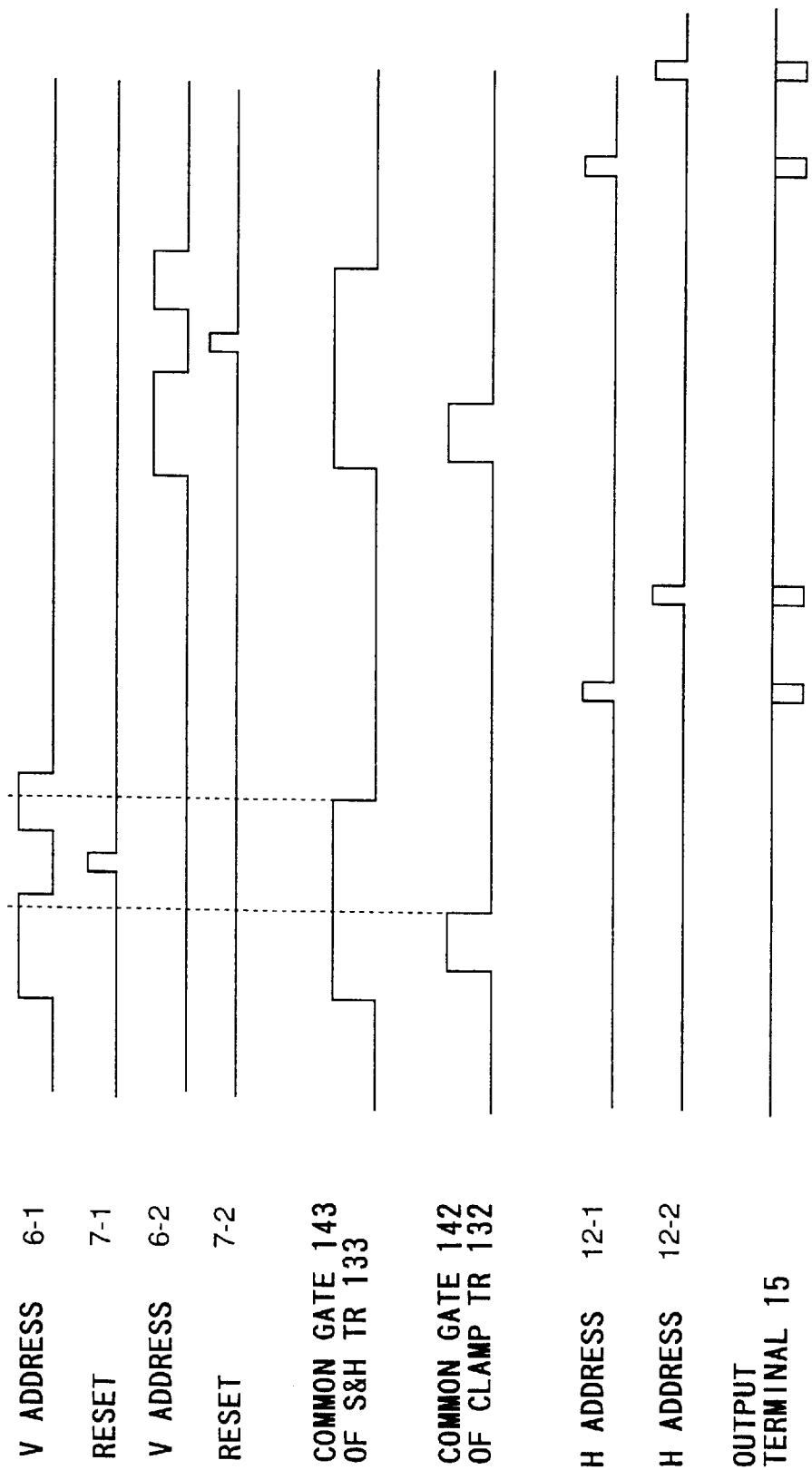
FIG. 22 is a timing chart showing the operation of the third embodiment.

FIG. 22 is a timing chart in this embodiment. The noise canceling operation principle is the same as that shown in FIG. 9.

Fourth Embodiment

Figure 23:
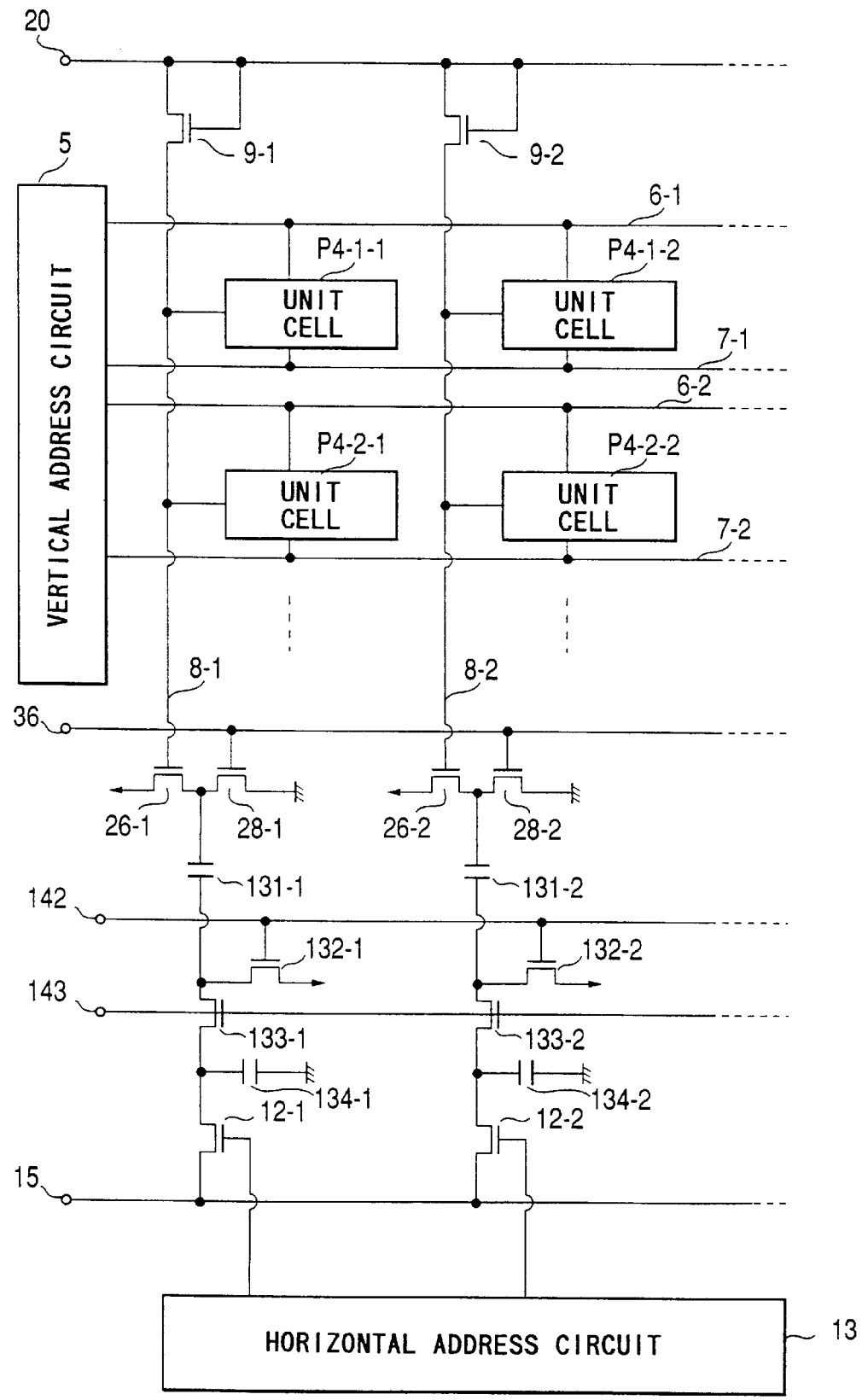
FIG. 23 is a circuit diagram showing the arrangement of an MOS-type solid-state imaging apparatus according to a fourth embodiment of the present invention.

FIG. 23 is a circuit diagram showing the arrangement of an imaging apparatus using an amplification-type MOS sensor according to the fourth embodiment of the present invention. The circuit arrangement of each unit cell P4-i-j is the same as that in the first embodiment.

In the fourth embodiment, the impedance converters in the first embodiment are connected to the noise cancelers in the third embodiment. Note that the common source of the clamp transistors 132 is DC-driven in this embodiment.

Fifth Embodiment

Figure 24:
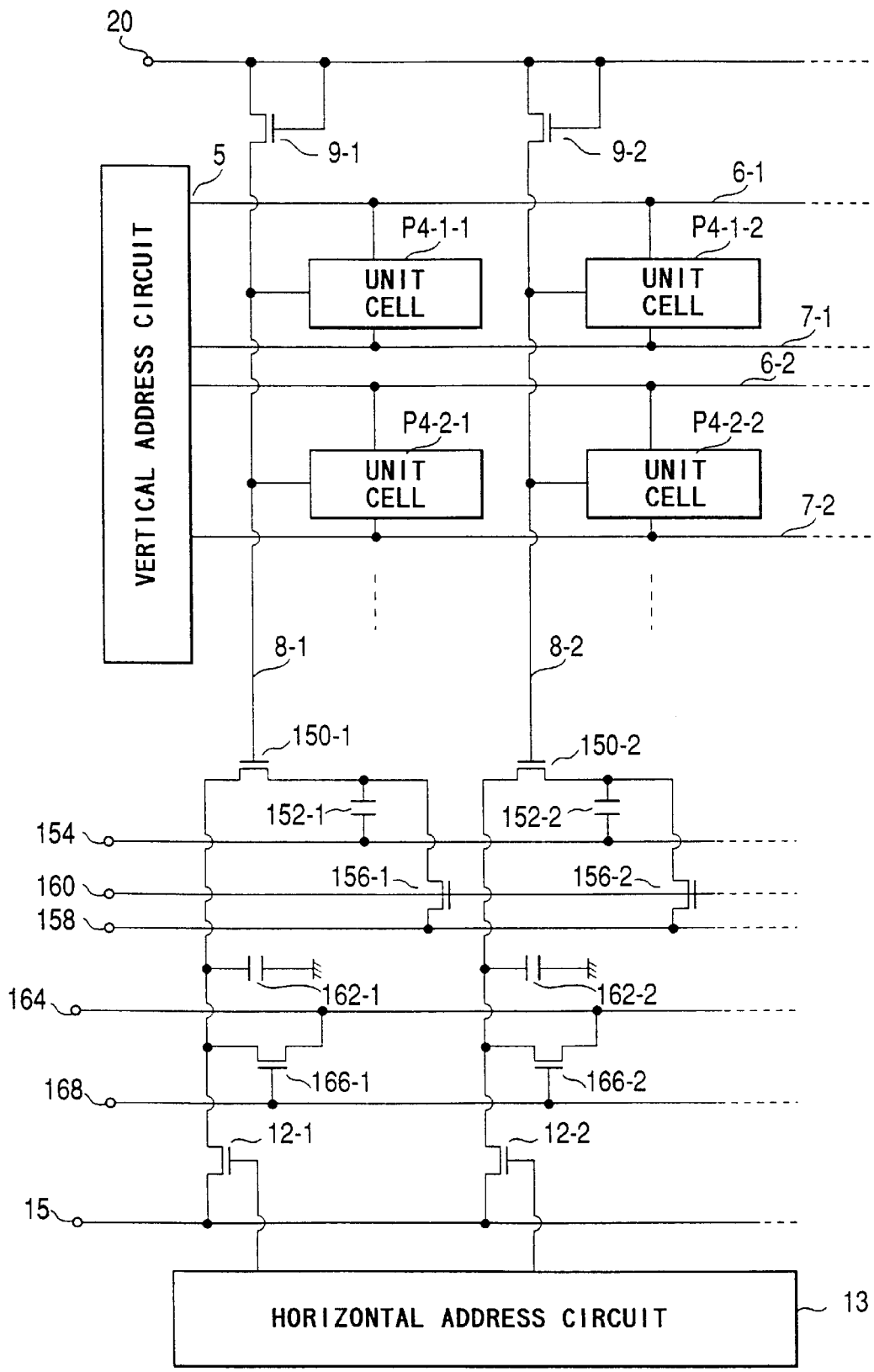
FIG. 24 is a circuit diagram showing the arrangement of an MOS-type solid-state imaging apparatus according to a fifth embodiment of the present invention.

FIG. 24 is a circuit diagram showing the arrangement of an imaging apparatus using an amplification-type MOS sensor according to the fifth embodiment of the present invention. The circuit arrangement of each unit cell P4-i-j is the same as that in the first embodiment.

The end portions of vertical signal lines 8-1, 8-2, . . . on the opposite side to the load transistors 9-1, 9-2, . . . are respectively connected to the gates of slice transistors 150-1, 150-2, . . . . One end of each of slice capacitors 152-1, 152-2, . . . is connected to the source of a corresponding one of the slice transistors 150-1, 150-2, . . . The other end of each of the slice capacitors 152-1, 152-2, . . . is connected to a slice pulse supply terminal 154. To reset the source potentials of the slice transistors 150-1, 150-2, . . . slice reset transistors 156-1, 156-2, . . . are connected between the sources of the slice transistors 150-1, 150-2, . . . and a slice power supply terminal 158. A slice reset terminal 160 is connected to the gates of the slice reset transistors 156-1, 156-2, . . .

Slice charge transfer capacitors 162-1, 162-2, . . . are connected to the drains of the slice transistors 150-1, 150-2, . . . To reset the drain potentials of the slice transistors 150-1, 150-2, . . . , reset transistors 166-1, 166-2, . . . are arranged between the drains of the slice transistors 150-1, 150-2, . . . and a storage drain power supply terminal 164. A drain reset terminal 168 is connected to the gates of the reset transistors 166-1, 166-2, . . . In addition, the drains of the slice transistors 150-1, 150-2, . . . are connected to a signal output terminal 15 through the horizontal selection transistors 12-1, 12-2, . . . which are driven by horizontal address pulses supplied from the horizontal address circuit 13.

As described above, the arrangement of each unit cell P4-i-j of the CMOS sensor in the fifth embodiment is the same as that in the first embodiment shown in FIG. 3, but the arrangement of each noise canceler differs from that in the first embodiment. The noise cancelers in the fifth embodiment are characterized in that voltages appearing on the vertical signal lines 8-1, 8-2, . . . are converted into charges through the gate capacitors of slice transistors 150, and noise is suppressed by performing subtraction in the charge domain.

In this device, if the value of the slice capacitor 152 is represented by Csl, the charge (second slice charge) to be finally output to the horizontal signal line 15 is given by:

Csl×(Vsch−V0ch)

That is, the device is characterized in that fixed pattern noise due to the threshold variation of the amplification transistors 64 in the unit cells is suppressed because the charge proportional to the difference between the voltage set when a signal is present and the voltage set when no signal is present after a reset operation, appears on the signal line. The circuit arrangement for converting a voltage appearing on the vertical signal line 8 into a charge, and performing subtraction in the charge domain in this manner can also be called a noise canceler.

Sixth Embodiment

Figure 25:
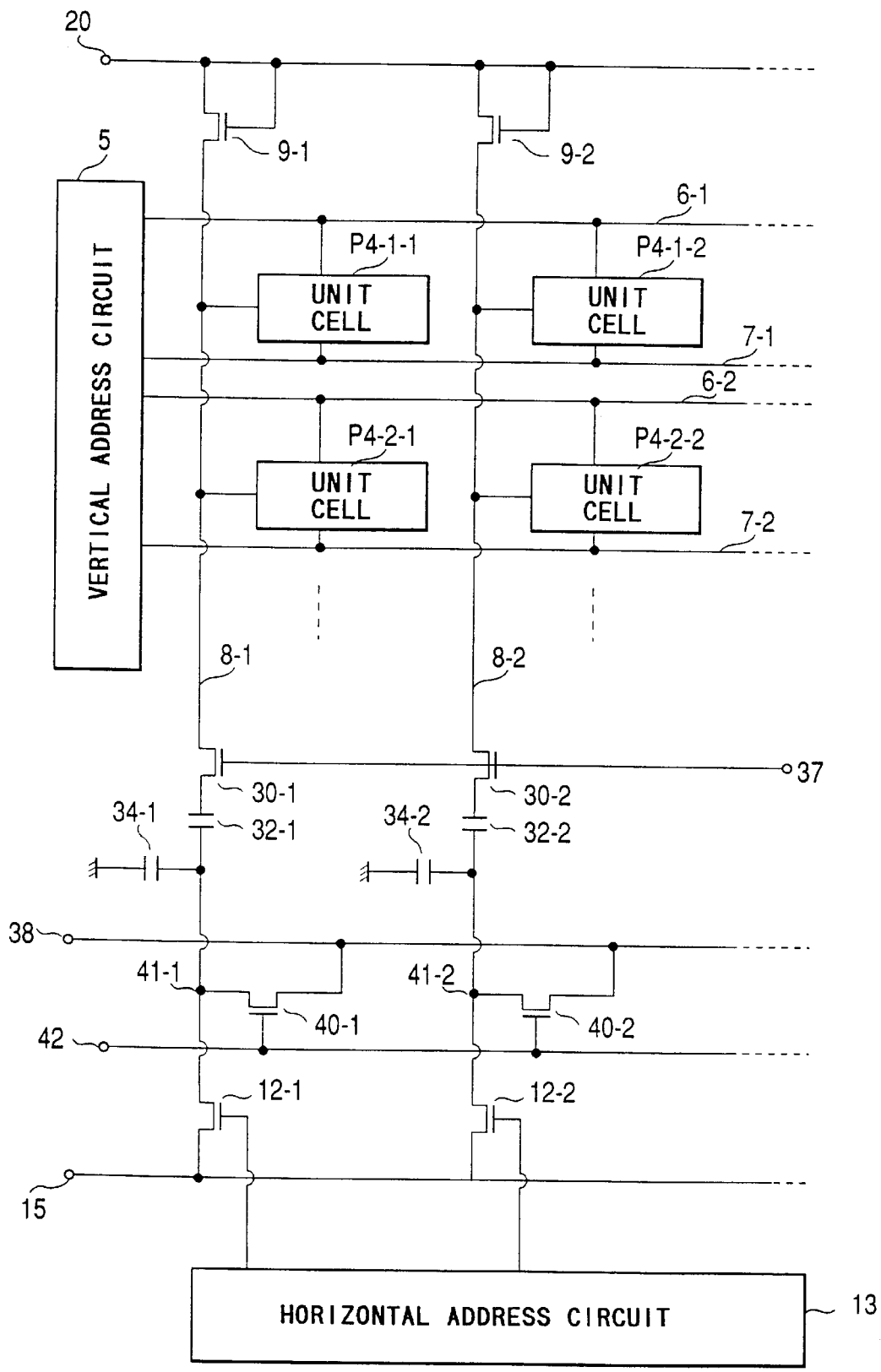
FIG. 25 is a circuit diagram showing the arrangement of an MOS-type solid-state imaging apparatus according to a sixth embodiment of the present invention.

FIG. 25 is a circuit diagram showing the arrangement of an imaging apparatus using an amplification-type MOS sensor according to the sixth embodiment of the present invention. The circuit arrangement of each unit cell P4-i-j is the same as that in the first embodiment.

The sixth embodiment is equivalent to the first embodiment shown in FIG. 3 from which the impedance converter constituted by the source follower transistors is omitted.

Seventh Embodiment

Figure 26:
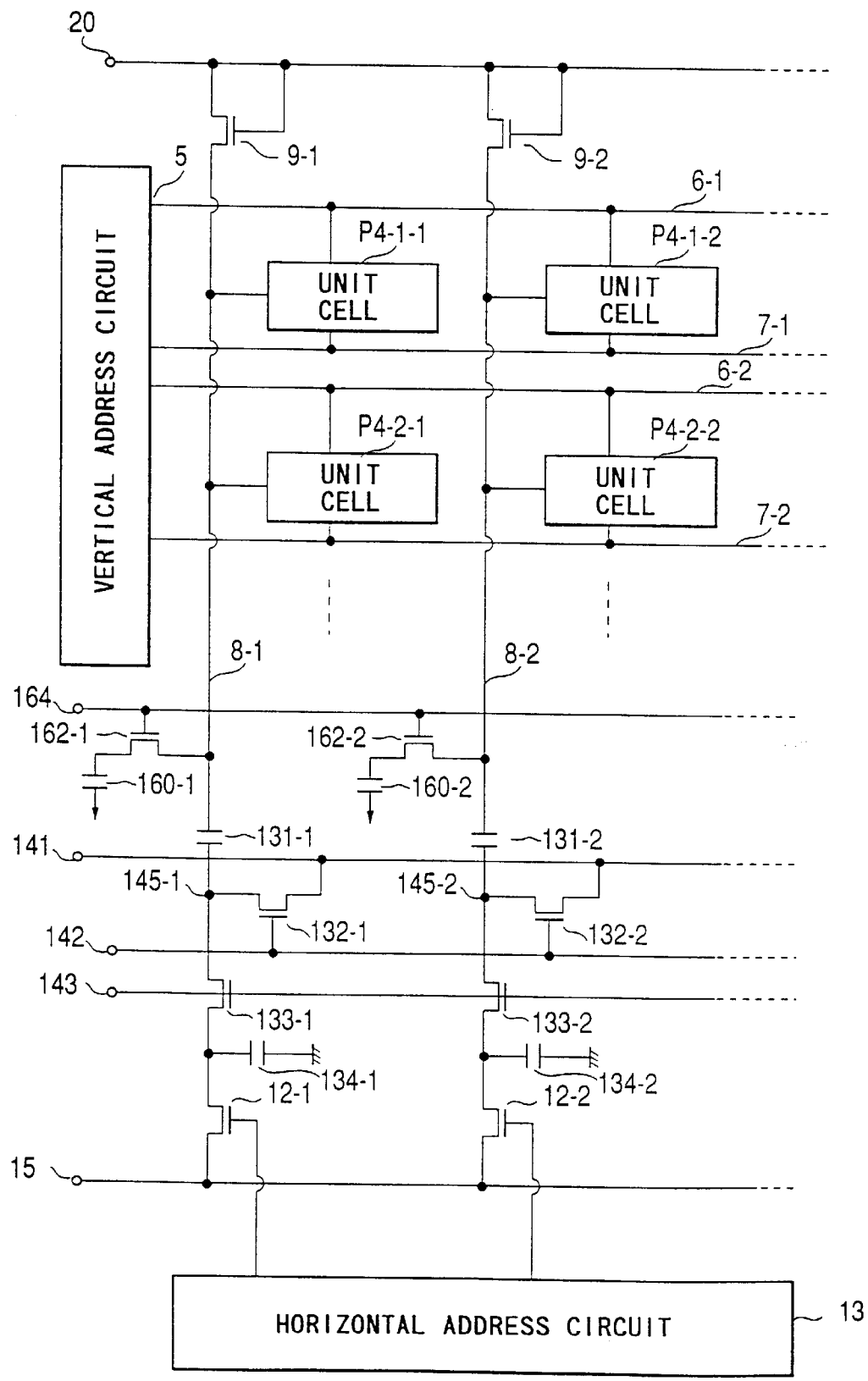
FIG. 26 is a circuit diagram showing a first arrangement of an MOS-type solid-state imaging apparatus according to a seventh embodiment of the present invention.
Figure 27:
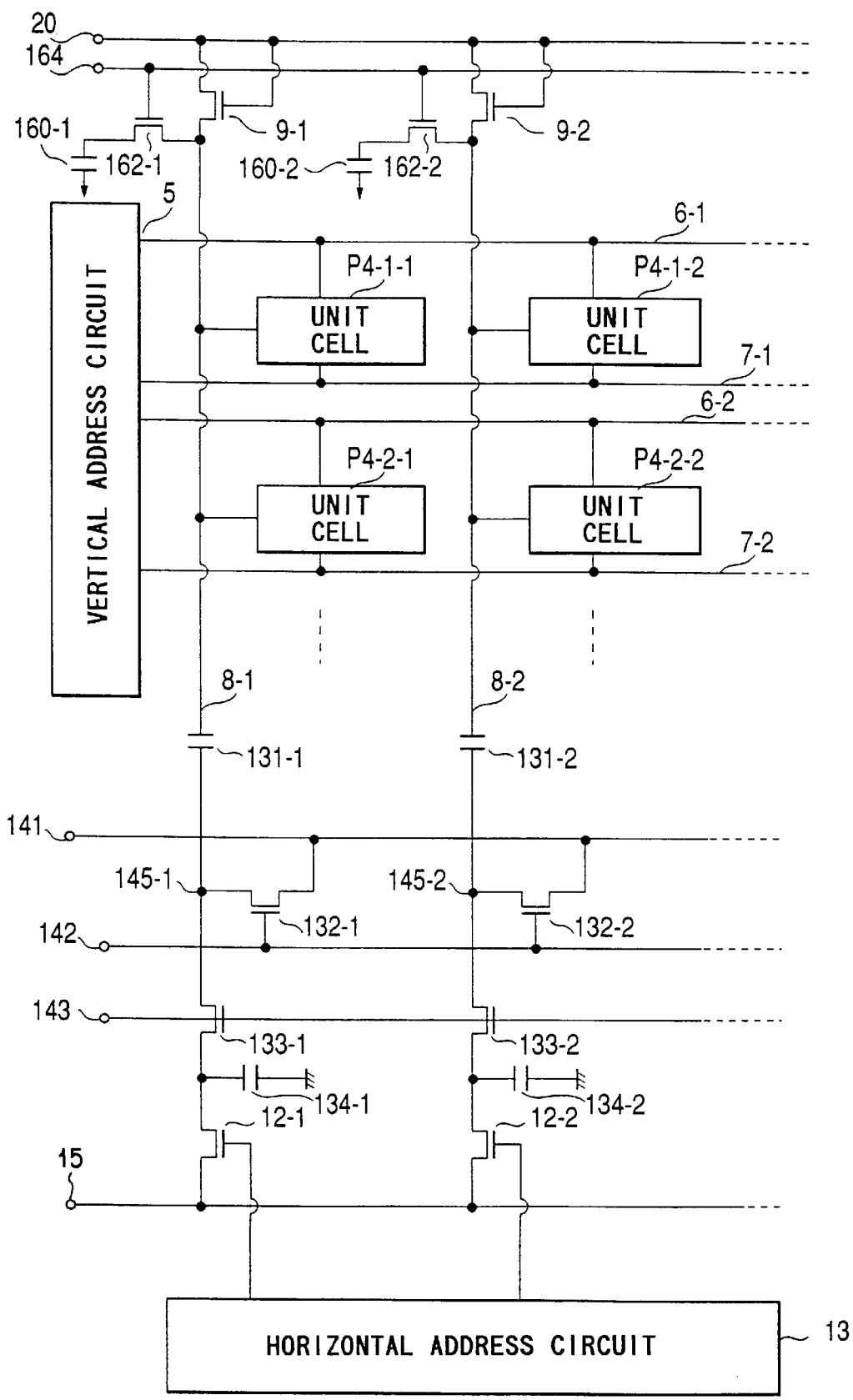
FIG. 27 is a circuit diagram showing a second arrangement of the MOS-type solid-state imaging apparatus according to the seventh embodiment of the present invention.

Each of FIGS. 26 and 27 is a circuit diagram showing the arrangement of an imaging apparatus using an amplification-type MOS sensor according to the seventh embodiment of the present invention. The circuit arrangement of each unit cell P4-i-j is the same as that in the first embodiment.

Although this embodiment and the third embodiment in FIG. 21 have many common parts, they differ in that capacitors Ccmp 160-1, 160-2, . . . for correcting the differences between the impedances of the noise cancelers, viewed from the unit cell side, in a signal pulse noise output operation and in a noise output operation are connected in parallel with the vertical signal lines 8-1, 8-2, . . . through switches 162-1, 162-2, . . . so as to be located on the imaging region (unit cell) side with respect to the clamp capacitors 131-1, 131-2, . . . In the case shown in FIG. 26, the correction capacitors 160 and the switches 162 are connected between the clamp capacitor 131 and the imaging region. In the case shown in FIG. 27, the correction capacitor 160 and the switch 162 are connected between the imaging region and the load transistor 9.

As described above, according to this embodiment, in the MOS-type solid-state imaging apparatus with the noise reduction circuits, the correction capacitors 160 are connected to the vertical signal lines 8 to suppress capacitance changes in a noise removing operation which are the cause of noise, thus further contributing to noise reduction. That is, since the impedance viewed from each cell remains the same in a signal plus noise output operation after selection of a photodiode and a noise output operation after a reset operation, noise canceling can be accurately performed.

Modifications of the seventh embodiment may be made such that correction capacitors are connected to the noise cancelers in the first embodiment in FIG. 3, the fourth embodiment in FIG. 23, and the sixth embodiment in FIG. 25.

The second to seventh embodiments described above differ from the first embodiment in the noise canceler portions. Other embodiments which differ from the first to seventh embodiments in the structure of each unit cell will be described next.

Eighth Embodiment

Figure 28:
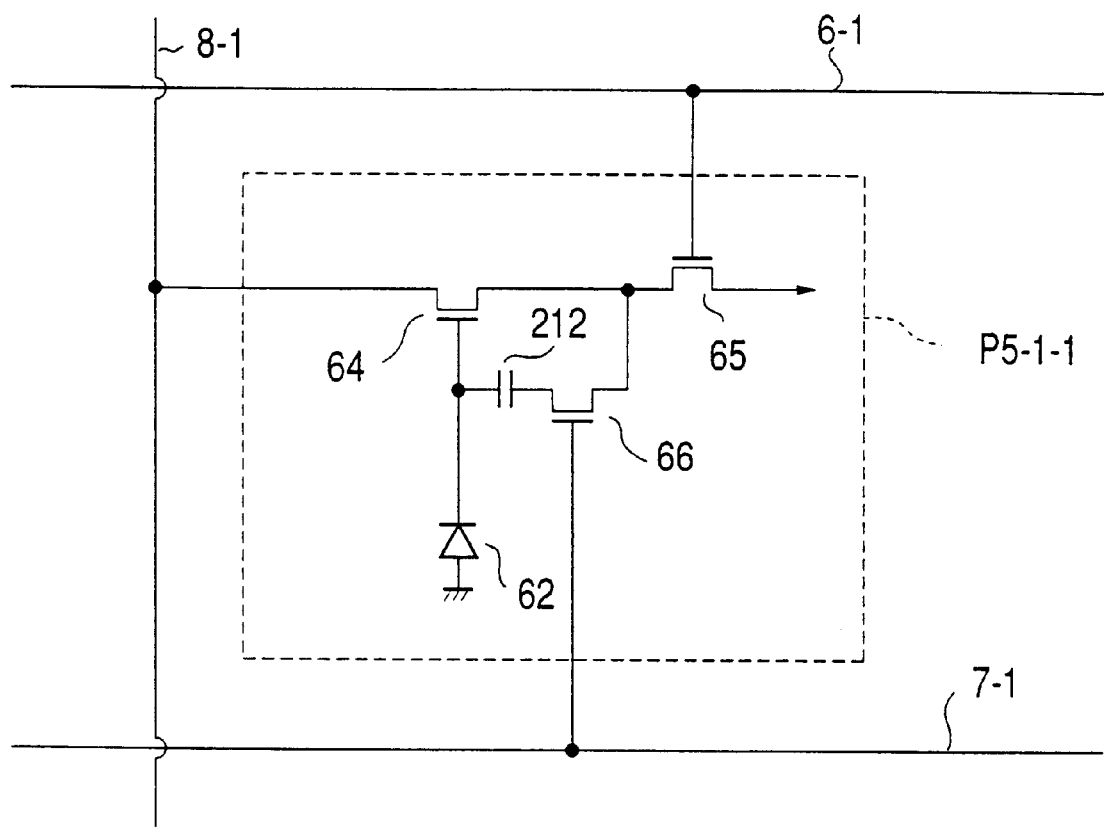
FIG. 28 is a circuit diagram showing the arrangement of the unit cells of an MOS-type solid-state imaging apparatus according to an eighth embodiment of the present invention.

Since the overall arrangement of this embodiment is the same as that of the first embodiment shown in FIG. 3, an illustration of the arrangement will be omitted. Note that this embodiment is characterized in that a unit cell P5 shown in FIG. 28 is used in place of the unit cell P4 in FIG. 3.

In the unit cell P5 of this embodiment, a feedback transistor (reset transistor) 66 is connected to the gate of the amplification transistor 64 through a feedback capacitor 212.

Ninth Embodiment

Figure 29:
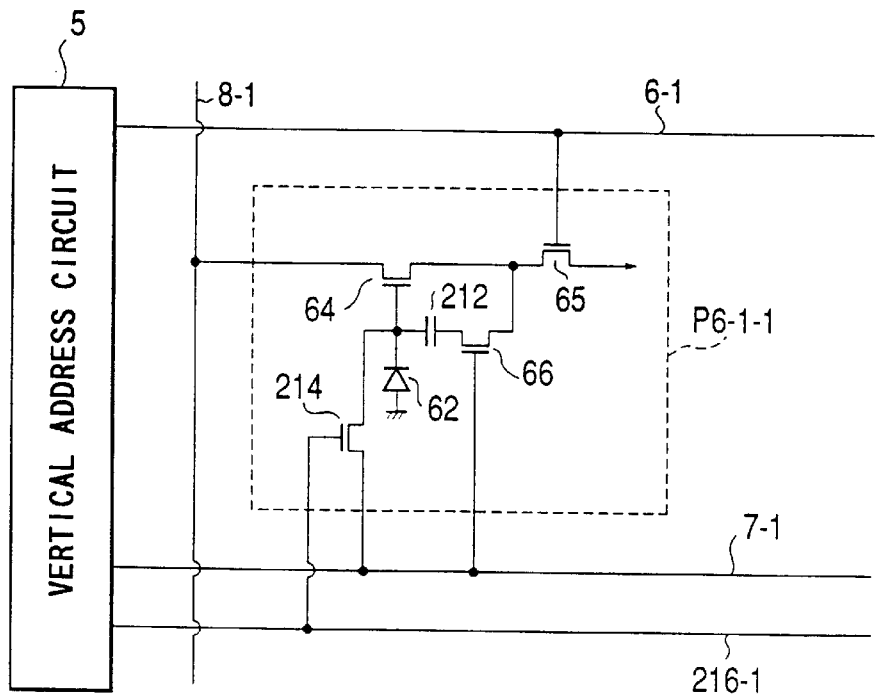
FIG. 29 is a circuit diagram showing the arrangement of the unit cells of an MOS-type solid-state imaging apparatus according to a ninth embodiment of the present invention.

Since the overall arrangement of this embodiment is the same as that of the first embodiment shown in FIG. 3, an illustration of the arrangement will be omitted. Note that this embodiment is characterized in that a unit cell P6 shown in FIG. 29 is used in place of the unit cell P4 in FIG. 3.

In addition to the arrangement in the eighth embodiment, the unit cell P6 in this embodiment has a discharge transistor 214 connected between the gate of the amplification transistor 64 and the reset line 7-1. The gate of the discharge transistor 214 is connected to the vertical address circuit 5 through a common gate line 216-1.

Tenth Embodiment

Figure 30:
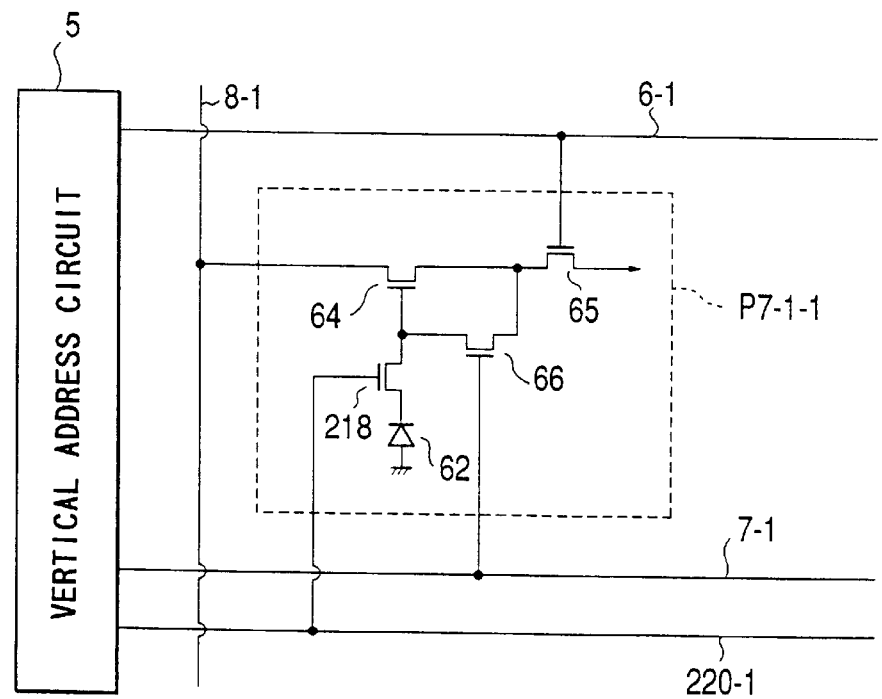
FIG. 30 is a circuit diagram showing the arrangement of the unit cells of an MOS-type solid-state imaging apparatus according to a tenth embodiment of the present invention.

Since the overall arrangement of this embodiment is the same as that of the first embodiment shown in FIG. 3, an illustration of the arrangement will be omitted. Note that this embodiment is characterized in that a unit cell P7 shown in FIG. 30 is used in place of the unit cell P4 in FIG. 3.

In addition to the arrangement in the first embodiment, the unit cell P7 in this embodiment has a transfer transistor 218 connected between the gate (the connection point between the gate and the reset transistor) of the amplification transistor 64 and the photodiode 62. The gate of the transfer transistor 218 is connected to the vertical address circuit 5 through a common gate line 220-1.

In the eighth to tenth embodiments, as in the first embodiment, the noise canceler can be modified. That is, the description made with reference to FIGS. 3 to 27 applies to the eighth to tenth embodiments.

The present invention is not limited to the above embodiments, and can be variously modified. If, for example, the amplification transistors of the unit cells can be manufactured without any threshold variation, since no fixed pattern noise is caused, the noise canceler can be omitted. If fixed pattern noise exerts no influence on the image quality, the noise canceler can also be omitted.

Although the gate and source of each load transistor are connected to the same power supply line, they may be connected to different power supplies. With this arrangement, a current flowing in each transistor can be controlled, and the power consumption can be reduced.

Figure 31:
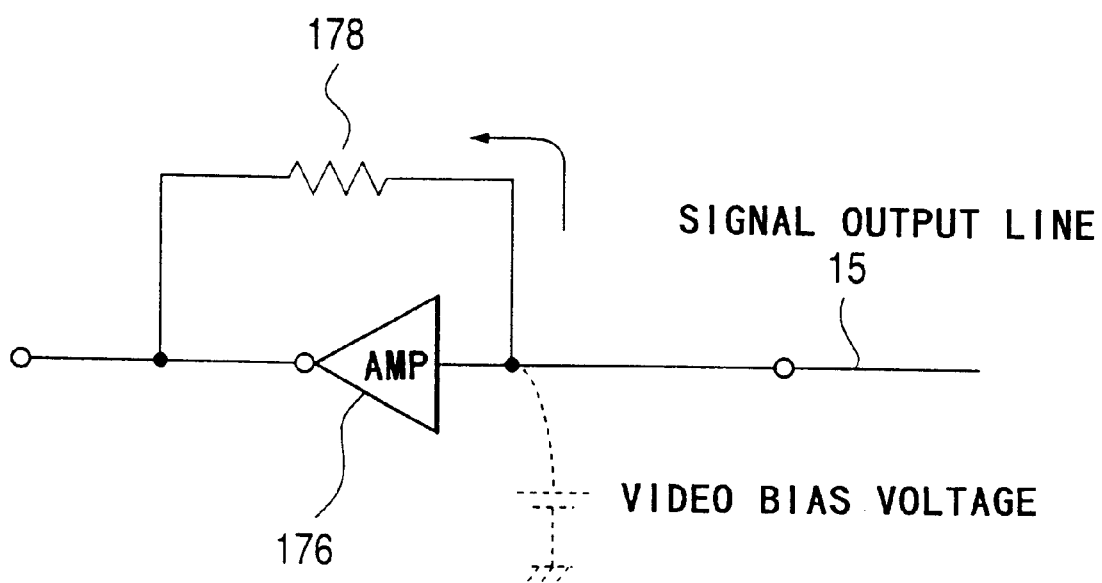
FIG. 31 is a circuit diagram showing a video amplifier connected to a horizontal signal line in a modification of the present invention.

In each noise canceler of each embodiment, since noise decreases as the signal current (only the noise component) read out in the absence of an input signal decreases, the voltage applied to the storage drain power supply terminal is preferably set to be almost equal to a video bias voltage. The video bias voltage is a voltage to which the horizontal signal line 15 is almost fixed when a signal is read out from the horizontal signal line 15 with a current. FIG. 31 shows a modification which realizes this arrangement. An operational amplifier 176 is connected to an output signal line 15, and a load resistor 178 is connected between the input and output terminals of the operational amplifier 176. According to this arrangement, a signal current is forcibly supplied to the load resistor 178, so that the horizontal signal line 15 is fixed to a virtual voltage, i.e., a video bias voltage.

In each embodiment described above, the unit cells are arranged in the form of a two-dimensional matrix. As is obvious, however, the present invention can be applied to an imaging apparatus having a one-dimensional array of unit cells.

As has been described above, according to the present invention, there is provided an amplification-type MOS-type solid-state imaging apparatus which can suppress the two-dimensional fixed pattern noise due to the variation in the threshold voltage of the amplification transistors.

What is claimed is:

1. An MOS-type solid-state imaging apparatus comprising:
    unit cells arranged in an array;
    means for selecting one of the unit cells,
    wherein each of said unit calls comprises:
        a photoelectric converter;
        an amplification transistor having a gate to which said photoelectric converter is connected and for amplifying an output signal from said photoelectric converter and output an amplified signal;
        a selection transistor having a gate to which said selecting means is connected and for selectively turning on said amplification transistor; and
        a reset transistor connected between a connection point between said amplification transistor and said selection transistor and a gate of said amplification transistor for selectively resetting the gate of said amplification transistor.

2. An MOS-type solid-state imaging apparatus according to claim 1, in which said unit cell further comprises a capacitor connected between said reset transistor and the gate of said amplification transistor.

3. An MOS-type solid-state imaging apparatus according to claim 2, in which said unit cell further comprises a charge discharge transistor connected between the gate of said amplification transistor and said reset transistor.

4. An MOS-type solid-state imaging apparatus according to claim 1, in which said unit cell further comprises a transfer transistor connected between a connection point between said reset transistor and said amplification transistor and said photoelectric converter.

5. An MOS-type solid-state imaging apparatus according to claim 1, which further comprises means for compensating for variations in amplification characteristics of said amplification transistors of said unit cells.

6. An MOS-type solid-state imaging apparatus according to claim 5, in which said compensating means comprises a noise canceler for subtracting a noise component from an output from said unit cell.

7. An MOS-type solid-state imaging apparatus according to claim 5, in which said compensating means comprises a noise canceler for subtracting a charge representing a noise component from a charge representing an output from said unit cell.

8. An MOS-type solid-state imaging apparatus according to claim 5, in which said compensating means comprises a source follower circuit to which the output signal from said unit cell is supplied, a sample/hold capacitor to which an output signal from said source follower circuit is supplied through a sample/hold transistor and a clamp capacitor, and a sample/hold transistor connected to a connection point between said sample/hold capacitor and said clamp capacitor to turn on/off the connection point.

9. An MOS-type solid-state imaging apparatus according to claim 8, in which said sample/hold capacitor and said clamp capacitor are stacked on each other.

10. An MOS-type solid-state imaging apparatus according to claim 5, in which said compensating means comprises a sample/hold capacitor to which the output signal from said unit cell is supplied through a clamp capacitor and a sample/hold transistor, and a clamp transistor connected to a connection point between said clamp capacitor and said sample/hold transistor to turn on/off the connection point.

11. An MOS-type solid-state imaging apparatus according to claim 10, in which said compensating means comprises correction means for reducing a difference between impedances of said clamp capacitor in ON and OFF periods.

12. An MOS-type solid-state imaging apparatus according to claim 11, in which said correction means comprises a correction capacitor for increasing a capacitance of said clamp capacitor while said clamp transistor is off.

13. An MOS-type solid-state imaging apparatus according to claim 5, in which said compensating means comprises a source follower circuit to which an output signal from said unit cell is supplied, a sample/hold capacitor to which an output signal from said source follower circuit is supplied through a clamp capacitor and a sample/hold transistor, and a clamp transistor connected to a connection point between said clamp capacitor and said sample/hold transistor to turn on/off said clamp capacitor.

14. An MOS-type solid-state imaging apparatus according to claim 5, in which said compensating means comprises a slice transistor having a gate to which an output signal from said unit cell is supplied, a slice capacitor and a slice reset transistor which are connected to a source of said slice transistor, and a slice charge transfer capacitor and a drain reset transistor which are connected to a drain of said slice transistor.

15. An MOS-type solid-state imaging apparatus according to claim 5, in which said compensating means comprises a sample/hold capacitor to which an output signal from said unit cell is supplied through a sample/hold transistor and a clamp capacitor, and a sample/hold transistor connected to a connection point between said sample/hold capacitor and said clamp capacitor to turn on/off the connection point.

16. An MOS-type solid-state imaging apparatus comprising:

an imaging region having unit cells arranged in a two-dimensional matrix, each unit cell being constituted by a photodiode, an amplification transistor having a gate to which an output from said photodiode is input, a vertical selection transistor connected in series with said amplification transistor, and a reset transistor connected between the drain and gate of said amplification transistor to discharge the signal from said photodiode;

vertical address lines connected to gates of said vertical selection transistors and arranged in a row direction;

a vertical address circuit for driving said vertical address lines;

vertical signal lines arranged in a column direction in which currents are read out from said amplification transistors;

load transistors each connected to one end of a corresponding one of said vertical signal lines;

horizontal selection transistors each connected to the other end of a corresponding one of said vertical signal lines;

a horizontal address circuit for sequentially supplying selection pulse signals to gates of said horizontal selection transistors; and a horizontal signal line for reading out signal currents from said vertical signal lines through said horizontal selection transistors.

17. An MOS-type solid-state imaging apparatus according to claim 16, which further comprises control means for turning on said reset transistor and turning off said vertical selection transistor, after turning on said vertical selection transistor to read out an amplified signal from said amplification transistor, and performing a feedback circuit operation to turn on the gate of said load transistor thereby setting a channel potential at the gate of said amplification transistor to a source potential of said load transistor which is given to said vertical signal line.

18. An MOS-type solid-state imaging apparatus according to claim 16, which further comprises a capacitor connected between the gate of said amplification transistor and said reset transistor.

19. An MOS-type solid-state imaging apparatus according to claim 18, which further comprises a discharge transistor connected to the gate of said amplification transistor.

20. An MOS-type solid-state imaging apparatus according to claim 16, which further comprises a transfer transistor connected between said photodiode and the gate of said amplification transistor.

21. An MOS-type solid-state imaging apparatus comprising:

an imaging region having unit cells arranged in a two-dimensional matrix, each unit cell being constituted by a photodiode, an amplification transistor having a gate to which an output from said photodiode is input, a vertical selection transistor connected in series with said amplification transistor, and a reset transistor connected between the drain and gate of said amplification transistor to discharge the signal from said photodiode;

vertical address lines connected to gates of said vertical selection transistors and arranged in a row direction;

a vertical address circuit for driving said vertical address lines;

vertical signal lines arranged in a column direction in which currents are read out from said amplification transistors;

load transistors each connected to one end of a corresponding one of said vertical signal lines;

horizontal selection transistors each connected to the other end of a corresponding one of said vertical signal lines through a separation transistor;

a hold capacitor connected in parallel with the other end of each of said vertical signal lines;

a horizontal address circuit for sequentially applying selection pulse signals to gates of said horizontal selection transistors; and a horizontal signal line for reading out signal currents from said vertical signal lines through said horizontal selection transistors.

22. An MOS-type solid-state imaging apparatus according to claim 21, in which said hold capacitor has a capacitor value substantially not less than a capacitor value of said vertical signal line.

* * * * *